United States Patent [19]
Sawin et al.

[11] Patent Number: 5,450,205
[45] Date of Patent: Sep. 12, 1995

[54] APPARATUS AND METHOD FOR REAL-TIME MEASUREMENT OF THIN FILM LAYER THICKNESS AND CHANGES THEREOF

[75] Inventors: Herbert H. Sawin, Arlington; William T. Conner, Somerville; Timothy J. Dalton, N. Reading; Emanuel M. Sachs, Somerville, all of Mass.

[73] Assignee: Massachusetts Institute of Technology, Cambridge, Mass.

[21] Appl. No.: 70,118

[22] Filed: May 28, 1993

[51] Int. Cl.⁶ .................. G01B 11/06; H01L 21/00
[52] U.S. Cl. .................... 356/382; 356/357; 156/626.1
[58] Field of Search ............... 356/381, 382, 355, 357, 356/345, 445; 250/560; 156/601, 612, 626, 627

[56] References Cited

U.S. PATENT DOCUMENTS

| | | | |
|---|---|---|---|
| 3,892,490 | 7/1975 | Uetsuki et al. | 356/382 |
| 4,053,234 | 10/1977 | McFarlane | 356/381 |
| 4,198,261 | 4/1980 | Busta et al. | 356/382 |
| 4,454,001 | 6/1984 | Sternheim et al. | 356/382 |
| 4,713,140 | 12/1987 | Tien | 356/381 |
| 4,841,156 | 6/1989 | May et al. | 356/381 |
| 5,034,617 | 7/1991 | Isobe | 356/357 |
| 5,042,949 | 8/1991 | Greenberg et al. | 356/382 |
| 5,056,923 | 10/1991 | Ebisawa et al. | 356/382 |

OTHER PUBLICATIONS

J. W. Coburn, "Summary Abstract: Diagnostics in Plasma Processing," *J. Vac. Sci. Technol. A* 4(3), 1830 (May/Jun. 1986).

A. G. Nagy, "Radial Etch Rate Nonuniformity in Reactive Ion Etching," *J. Electrochem. Soc.* 131(8), 1871 (Aug. 1984).

Alan S. Kao & Harvey G. Stenger, Jr., "Analysis of Nonuniformities in the Plasma Etching of Silicon," *J. Electrochem. Soc.* 137(3), 954 (Mar. 1990).

Paul J. Marcoux & Pang Dow Foo, "Methods of End Point Detection for Plasma Etching," *Solid State Technology*, 24(4), 115 (Apr. 1981).

Sternheim, W. van Gelder & A. W. Hartman, "A Laser Interferometer System to Monitor Dry Etching of Patterned Silicon," *J. Electrochem. Soc.* 130(3), 665 (Mar. 1983).

F. Heinrich, H.-P. Still, and H.-C. Scheer, "New and Simple Optical Method to in situ etch rate determination and endpoint detection," *Appl. Phys. Lett.* 55(14), 1474 (Jul. 1989).

S. A. Henck, "In situ Real-Time Ellipsometry for Film Thickness Measurement and Control," *J. Vac. Sci. Technol. A* 10(4), 934 (Jul./Aug. 1992).

D. Angell & G. S. Oehrlein, "Grazing Angle Optical Emission Interferometry for End-Point Detection," *Appl. Phys. Lett.* 58(3), 240 (Jan. 1991).

J. T. Davies, T. Metz, R. N. Savage & H. Simmons, "Real-time, in situ Measurement of File Thickness and Uniformity During Plasma Ashing of Photoresist," *Proc. SPIE*, 1392, 551 (1990).

D. Economou, E. Aydil & G. Barna, "In situ Monitoring of Etching Uniformity in Plasma Reactors," *Solid State Technology*, 34(4), 107 (Apr. 1991).

(List continued on next page.)

*Primary Examiner*—Hoa Q. Pham
*Attorney, Agent, or Firm*—Steven J. Weissburg

[57] ABSTRACT

A new technique has been developed to measure etching or deposition rate uniformity in situ using a CCD camera which views the wafer during plasma processing. The technique records the temporal modulation of plasma emission or laser illumination reflected from the wafer; this modulation is caused by interferometry as thin films are etched or deposited. The measured etching rates compare very well with those determined by Helium-Neon laser interference. This technique is capable of measuring etching rates across 100-mm or larger wafers. It can resolve etch rate variations across a wafer or within a die. The invention can also be used to make endpoint determinations in etching operations as well as measuring the absolute thickness of thin films.

29 Claims, 13 Drawing Sheets

OTHER PUBLICATIONS

D. A. Danner, M. Dalvie, and D. W. Hess, "Plasma Etching of Aluminum: A Comparison of Chlorinated Etchants," *Electrochem. Soc.* 134(3), 669 (Mar. 1987).

Konstantino P. Giapis, Geoffrey R. Scheller, Richard A. Gottscho, William S. Hobson & Yong H. Lee, "Microscopic and Macroscopic Uniformity Control in Plasma Etching," *Appl. Phys. Lett.* 57(10), 983 (Sep. 1990).

IBM Technical Disclosure Bulletin, vol. 28, No. 5, Oct. 1985, "Etching End-Point Detector Employing Laser Interferometer and Video Display".

Babic, D., Trynolds, T, Hu, E and Bowers, J., "In situ characterization of sputtered thin films using a normal incidence laser reflectormeter," J. Vac. Sci. Technol. A 10(4) Jul./Aug. 1992, pp. 939-944.

Kamins, T. I., and Dell'Oca, C. J., "In-Process Thickness Monitor for Polycrystalline Silicon Deposition," J. Electrochem. Soc.: Solid-State Science and Technology, Jan. 1972, pp. 112-114.

Park, K. O., and Rock, F. C., "End Point Detection for Reactive Ion Etching of Aluminum," GTE Laboratories Technical Notes, vol. 131, No. 1 (Jul. 1983).

Danner, D. A., and Hess, D. W., "The Effect of Temperature and Flow Rate on Aluminum Etch Rates in RF Plasmas," J. Electrochem. Soc.: Solid-State Science and Technology, vol. 133, No. 1, pp. 151-155 (Jan. 1986).

Economou, D. J., Park, S., and Williams, G. D., "Uniformity of Etching in Parallel Plate Plasma Reactors," J. Electrochem. Soc., vol. 136, No. 1, Jan. 1989, pp. 188-198.

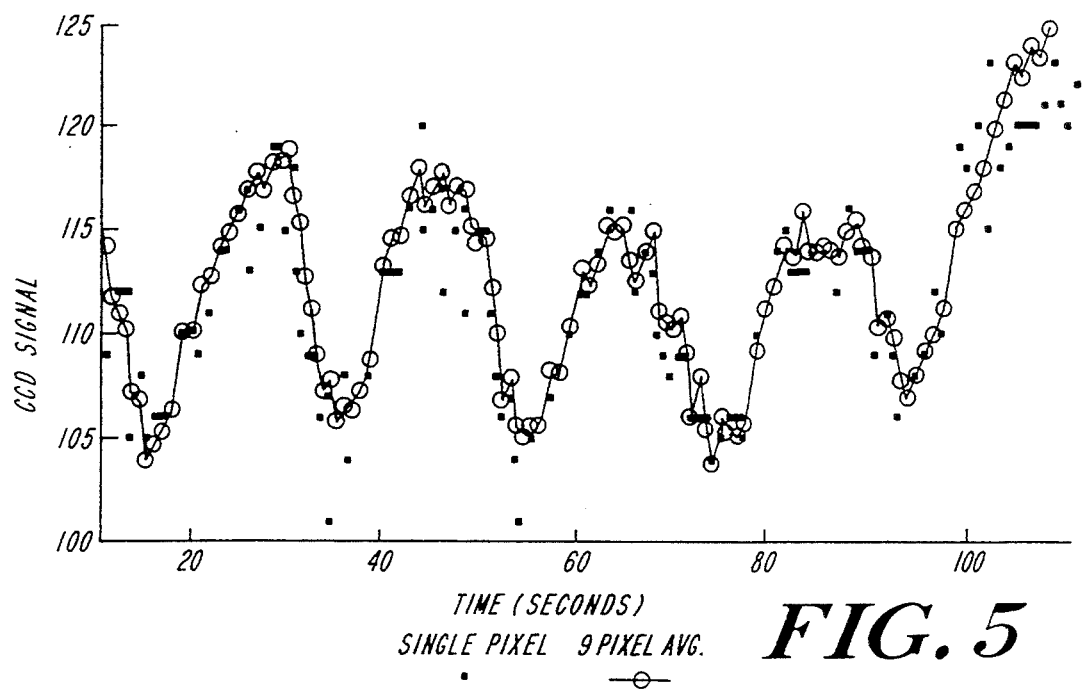
FIG. 5
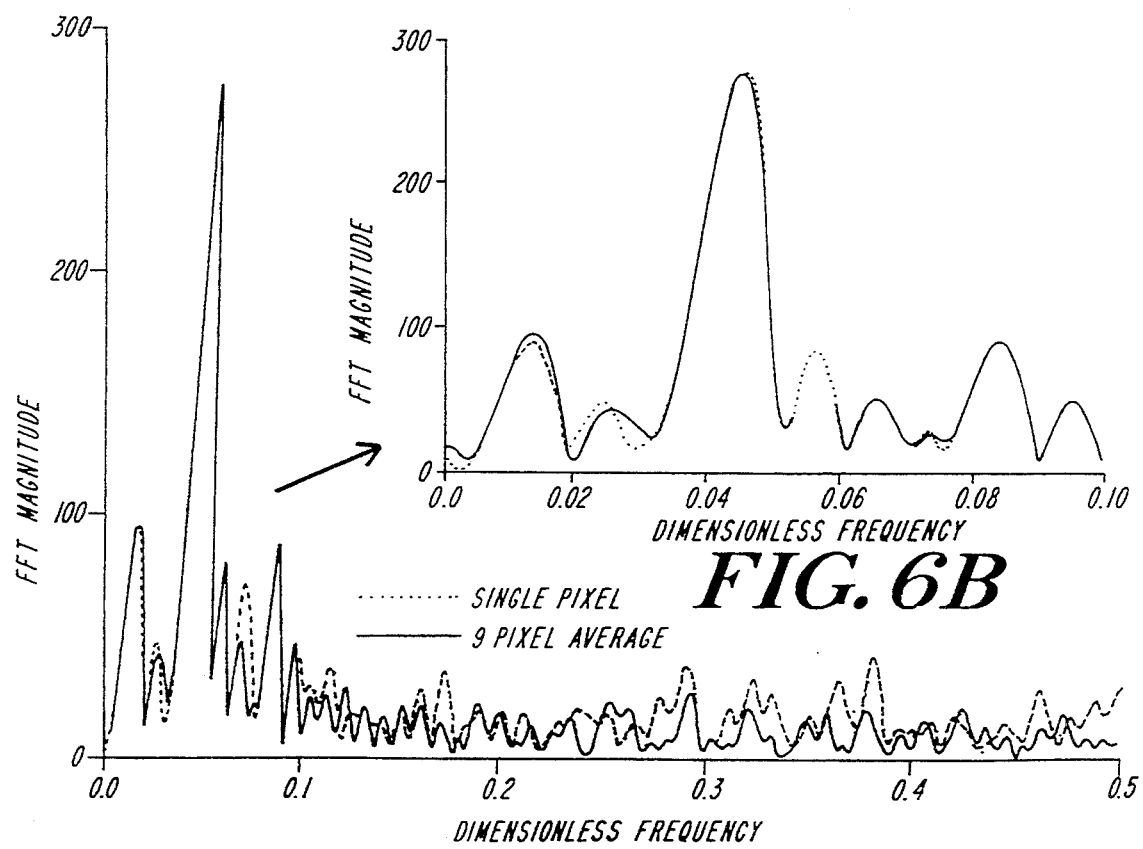
FIG. 6B
FIG. 6A

APPARATUS AND METHOD FOR REAL-TIME MEASUREMENT OF THIN FILM LAYER THICKNESS AND CHANGES THEREOF

The present invention relates generally to the field of thin film analysis. The invention relates more specifically to the field measuring the thickness of a thin film. The invention has applications in the semiconductor fabrication field as well as other thin film fields.

BACKGROUND

Uniformity of film etching rate and uniformity of film thickness has always been an important issue in plasma etching. Wafer-to-wafer uniformity within a batch is no longer a major concern because batch reactors that treat numerous small wafers are being replaced with large, single-wafer etchers. A dominant concern that remains is etching process uniformity across a single wafer, especially as silicon wafer diameters are increasing. See, J. W. Coburn, "Summary Abstract: Diagnostics in Plasma Processing," *J. Vac. Sci. Technol. A* 4(3), 1830 (1986). State-of-the-art wafer processing is done on 200-mm diameter wafers. The next generation of wafers will probably be 250 and/or 300-mm diameter.

Process parameters include the uniformity of etching rate, and the absolute thickness of specific structures. Presently, rate uniformity is determined ex situ, and after the etching step, by optically measuring film thickness (for example, with a Nanospec) before and after a partial etch of known duration. See generally, A. G. Nagy, "Radial Etch Rate Nonuniformity in Reactive Ion Etching," *J. Electrochem. Soc.* 131(8), 1871 (1984) and Alan S. Kao & Harvey G. Stenger, Jr., "Analysis of Nonuniformities in the Plasma Etching of Silicon," *J. Electrochem. Soc.* 137(3), 954 (1990). This process is not suitable as a diagnostic for real-time process control, i.e., control of the etching process as it is being conducted.

A number of techniques exist to measure etching rate and/or film thickness in situ. Among these are laser interferometry, optical emission interferometry ("OEI") and ellipsometry. See generally Paul J. Marcoux & Pang Dow Foo, "Methods of End Point Detection for Plasma Etching," *Solid State Technology*, 24(4), 115 (1981)(laser interferometry) and Sternheim, W. van Gelder & A. W. Hartman, "A Laser Interferometer System to Monitor Dry Etching of Patterned Silicon," *J. Electrochem. Soc.* 130(3), 655 (1983); F. Heinrich, H.-P. Still, and H.-C. Scheer, "New and Simple Optical Method to in situ etch rate determination and endpoint detection," *Appl. Phys. Lett.* 55(14), 1474 (1989)(OEI); and David Angell & Gottlied S. Oehrlein, "Grazing Angle Optical Emission Interferometry for End-Point Detection," *Appl. Phys. Lett.* 58(3), 240 (1991); and Steven A. Henck, "In situ Real-Time Ellipsometry for Film Thickness Measurement and Control," *J. Vac. Sci. Technol.* A 10 (4), 934 (1992).

Laser interferometry and optical emission interferometry both analyze the interference of light reflected from a thin film, but they use different light sources. Laser interferometry uses a laser beam (typically a 632.8 nm Helium-Neon (HeNe), while optical emission interferometry uses etch reactor plasma optical emission as the light source. Ellipsometry measures the change in polarization of light upon reflection of the light from a surface.

FIG. 1 depicts a thin film 100 of thickness d and refractive index $n_2$ on a wafer substrate 120 with refractive index $n_3$. A pedestal 122 supports the wafer substrate 120. (In some cases, more than one thin film layers will make up the thin film layer 100. In such a case, the light is reflected at each interface of different indices of refraction. Further, the upper most layer may have a patterned photoresist layer coating it.) Light rays 102 at a wavelength of λ travel through a first medium 130 with a refractive index $n_1$ and strike the interface between the medium 130 and the thin film 100 at an angle $\theta_1$ relative to the surface normal. Part 104 of the light rays 102 are refracted inside the film to an angle $\theta_2$ to the surface normal. Another part 106 of the incident light ray is reflected from the interface between the first medium 130 and the film 100. Following the development of Hecht & Zajac (Eugene Hecht & Alfred Zajac, OPTICS (Addison Wesley, Reading Mass., 1979), p.295–297), the optical path length difference, $\Delta l_{opt}$, between light 106 reflected from the interface between the first medium 130 and the film 100 on the one hand, and light 108 that has traveled through the film 100 and been reflected from the lower interface between the film 100 and the wafer substrate 120 on the other hand can be written as:

$$\Delta l_{opt} = \frac{2n_2 d}{\cos(\theta_2)} - 2n_1 d \tan(\theta_2)\sin(\theta_1). \quad (1)$$

Light rays 110, which are the result of multiple reflections within the film, are usually sufficiently low in intensity that they can be neglected in the analysis discussed below. Using Snell's Law, equation (1) can be written in terms of θ alone, and simplified to yield:

$$\Delta l_{opt} = 2 n_2\, d \cos(\theta_2). \quad (2)$$

A maximum in the intensity of the net reflected light resulting from interference between the two reflected light rays 106 and 108 will occur when the optical path difference $\Delta l_{opt}$ is an integral multiple of the wavelength λ of the light. If $n_1$ is assumed to be 1, then $\Delta d_{film}$, the change in film thickness that has occurred between the occurrence of adjacent (in time) maxima or minima (known as "extrema"), is given by:

$$\Delta d_{film} = \frac{\lambda}{2 n_2 \cos(\theta_2)}. \quad (3)$$

For normal incidence, (i.e., $\theta_1 = \theta_2 = 0$) Eq. (3) reduces to simply $$\Delta d_{film} = \frac{\lambda}{2 n_2}. \quad (4)$$

The term $\cos(\theta_2)$ is a correction for non-normal incidence, which can be rewritten in terms of measurable parameters (i.e., $\theta_1$ and $n_2$) as:

$$\cos(\theta_2) = \sqrt{\left(1 - \left[\frac{\sin(\theta_1)}{n_2}\right]^2\right)}. \quad (5)$$

A practical known apparatus for laser interferometry is shown in FIG. 2. An incident beam "I" from HeNe laser 202 strikes the interface between the wafer 208 and the chamber environment 230 such as a plasma of the reactor chamber 214. The reflected beam "R" is directed through a bandpass filter 210 to a photodiode 212, where an interferometry signal is recorded as a function of time. The bandpass filter 210 prevents plasma emission (i.e. unwanted light) from entering the photodiode 212, while allowing the reflected laser beam R to strike the photodiode 212.

Similarly, a known optical emission interferometry apparatus is shown in FIG. 3. Light C is collected from the chamber environment 230 within chamber 214 with a lens 218, and passed through a bandpass filter 220 and into a photodiode 212. Here, the bandpass filter 220 defines the wavelength of light being used for interference and blocks light at unwanted wavelengths to prevent the plasma background from reaching the photodiode 212. The etching rate is calculated as $$ER = \frac{\Delta d_{film}}{\delta_{tm}}, \quad (6)$$

where $\delta_{tm}$ is the measured time between received adjacent (in time) maxima or adjacent minima in the interferometry signal.

Using the known apparatus, the spatial relationship between the region of the film 208 being analyzed, the lens 218 and the photodiode 212 is such that the light from a specific spot on the film is not focused on the photodiode. The photodiode is located roughly at the focal length of the lens. Thus, all of the light from over a relatively large region of the film 208 is delivered to the photodiode, which registers essentially an average effect over the entire area. Even if light from only a relatively small region of the film is focused onto the photodiode, the photodiode signal does not provide any information about the location of the region on the film. Thus, another method must be used to determine this location, such as a laser pointing device, or a line of sight approximation.

Both optical emission and laser interferometry have been used to monitor etch rate at different locations in situ. Davies et al. monitored photoresist thickness using a white light excitation source and a photodiode spectrometer array. Etching rate could have been determined at up to five regions on a wafer; however, this was not done (the method was mentioned, but etching rate measurements were made only over a single region). See John T. Davies, Thomas Metz, Richard N. Savage & Horace Simmons, "Real-time, in situ Measurement of File Thickness and Uniformity During Plasma Ashing of Photoresist," *Proc. SPIE*, 1392, 551 (1990), using white light and a view window as large as the analysis region.

Economou et al. measured etch rate in situ at five regions across a wafer by multichannel laser interferometry. However, their technique is not readily applicable to industrial plasma etching tools. It requires a-priori selection of sites for analysis and the splitting and alignment of multiple laser beams. Without some extrinsic evidence, such as correlation with an image taken by a standard image capture device, it is difficult to know from the light signal collected what location on the wafer is being analyzed. It is similar to viewing the night sky through a telescope, without being able to take stock of a larger field of view to identify the relationship between the scene in the telescope and the known constellations.

Also, the multichannel laser interferometry technique requires an optical viewport the same diameter as the wafer being measured to obtain a full wafer view. See D. Economou, E. Aydil & G. Barna, "In situ Monitoring of Etching Uniformity in Plasma Reactors," *Solid State Technology*, 34(4), 107 (1991). Wafers are now normally 200 mm across and will soon be 250–300. Standard viewing windows that are available in reactors are on the order of 50 mm (two inches) across. It is difficult to change the size of a window in a standard reactor. Further, changing the size of such a window may change conditions inside the reactor. In addition, it is advantageous for the etching process to keep the window as small as possible. It is commonly necessary to replace windows that are affected by the etching process. Smaller windows are less expensive to replace. Further, the etchant removes window constituents and those constituents become part of the plasma environment, acting as contaminants. It is beneficial to minimize this contaminating effect.

The use of in situ ellipsometry to measure etching rates is fairly new and has not been used to measure rate uniformity.

It would also be beneficial to be able to determine the uniformity of the rate of film removal in processes other than plasma wafer etching.

In addition to the removal of thin film material, it is useful to be able to know the rate of change of film thickness in processes where additions are made to the thickness of regions of thin films, over the entire surface area of the film. Such processes include: sputter deposition; chemical vapor deposition ("CVD"); plasma enhanced CVD; physical vapor transport; evaporation, thermal processing and others.

It is also useful to be able to determine the absolute thickness of a thin film, either as it is being etched away from or added to a preexisting substrate. For instance, in etching, it is useful to know when all of the film at a certain location has been etched away from a substrate (the so-called process "end-point") so that the etching process can be stopped. End-point is typically identified by observing a characteristic, and then noting when the characteristic undergoes a gross change. The change typically signifies that the endpoint has been reached, and that the process has changed. For instance, as shown in FIG. 1, as the thin film 100 is being etched away, the plasma environment will include a certain chemical composition. After the thin film is all removed, the substrate wafer 120 begins to slowly etch away, and the chemical composition of the plasma environment changes. This change in environment can be noted, and used to identify the occurrence of the endpoint.

This method of endpoint determination has drawbacks. First, the wafer reaches endpoint at different times at different locations around the wafer. However, the known methods typically give only information about the state of a single point or the average state of the entire wafer, for instance when endpoint has been reached at enough locations so that the chemical composition of the reactor environment has changed to a certain degree. Thus, known techniques are not very sensitive. Further, such techniques require that the process actually proceed beyond the minimal endpoint. This is undesirable, for processes which can not tolerate much, if any, overshoot. Further, such techniques are not suitable for monitoring operations where film is being added to a layer, rather than being removed, because there is typically no physical change in the environment when such an accumulative endpoint has been reached.

There are also other instances in which it is beneficial to know the absolute thickness of a film, for instance to evaluate the uniformity of film thickness at the outset or end of a process.

Thus, a significant need exists to be able to monitor and measure the uniformity across a wafer of the rate that material is being etched away from or deposited upon a substrate. It is desirable to be able to monitor etching rate in real-time, as the film material is being etched away, so that process parameters can be changed or observed to bring the etching rate into uniformity or as desired. There is also a similar need for apparatus that can monitor and measure the rate of addition of material to a substrate. It is desirable to monitor the process over the entire surface of a workpiece, such as a wafer, for instance on the order of at least 200 to 300 mm in diameter, while requiring a viewing port of no more than a much smaller diameter, e.g. on the order of 50 mm, as is common with a standard plasma reactor. It is also an object of the invention to determine the absolute thickness of films that are being either etched away from or added to a body of film, without needing to know the original thickness, or the history of etching rate. Further, it is desirable to be able to measure the absolute thickness over the entire surface area of a thin film, through a viewing port that is significantly smaller than the subject film. Another object of the invention is to readily identify the locations on the thin film that are being analyzed, without need to resort to an additional image capture or laser direction device.

SUMMARY

A preferred embodiment of the invention is an apparatus for measuring change in the thickness of a thin film on a substrate. The apparatus comprises a support for the thin film and substrate and, spaced away from the support, an array of means for sensing electromagnetic radiation (such as light) reflected from the thin film, the array providing an individually recoverable signal for each sensing means of the array, each signal corresponding to a region of the film. A filter transmits electromagnetic radiation of at least one selected range of wavelengths to the array. A lens for focusing electromagnetic radiation reflected from the film is arranged between the thin film and the array such that an image of a region of the film is focused onto said array. A storage is provided for storing a time sequence of data signals corresponding to the signals generated by the array over a period of time in response to radiation transmitted through said filter means. The storage is connected to data processing means for comparing the data signals for at least one sensing means of the array over a portion of the time period, and from the comparison, determining the change of the thickness of the film over the portion of the time period at the region of film focused upon array. The apparatus may also include a timer to measure the time over which the signals have been collected, from which the data processing means can determine the rate of change of the film thickness. The data processor can also compare such changes in thickness or such rates of change of thickness from one region of the wafer to another, thereby providing a measure of the uniformity of such parameters over the wafer.

According to a preferred embodiment, the array of sensors is a CCD. The apparatus may include a display, for displaying an image of the wafer generated from the signals. The image may be modified from time to time to indicate the change in thickness over time of the various regions of the wafer at different times, as well as the rate of change of thickness. The apparatus may be used in conjunction with a walled environment, such as a plasma etching apparatus, having a window for passage of the light. The window may be smaller than the analysis region of the wafer, due to the focusing action of the lens.

According to another preferred embodiment, the filter is capable of sequentially transmitting radiation of at least two different ranges of wavelengths. The intensity of the light received indicates the reflectivity of the wafer. The data processing equipment may include means for correlating the measured reflectivities for each wavelength, to known reflectivities for wavelengths for certain film thicknesses, thereby enabling determination of the absolute film thickness.

Another preferred embodiment of the invention is an apparatus for collecting information regarding the change in the thickness of a thin film being reduced in thickness on a substrate. For instance, the operator can determine whether an etching endpoint has been reached. The apparatus comprises a support for the thin film and substrate. Spaced away from the support is an array of means for sensing electromagnetic radiation (such as light) reflected from the thin film, the array providing an individually recoverable signal for each sensing means of the array, each signal corresponding to a region of the film. A filter transmits electromagnetic radiation of at least one selected range of wavelengths to the array. A lens for focusing electromagnetic radiation reflected from the film is arranged between the thin film and the array, such that an image of a region of the film is focused onto the array. Connected to the array are storage means for storing a time sequence of data signals corresponding to the signals generated by the array of sensing means over a period of time in response to radiation transmitted through the filter. The operator can use the data stored to determine if individual components of the time sequence of data conform or not to a predetermined relationship among the data, such as rates of change of amplitude, thus determining whether certain process points have been reached.

Another preferred embodiment of the invention is a method for determining when a layer of a thin film has been completely removed by a thickness reduction process at a plurality of locations over the area of said thin film. The method comprises the steps of reflecting electromagnetic radiation from the thin film during the time the film is being reduced in thickness. At least one selected range of wavelengths of electromagnetic radiation reflected from the film is focused onto an array of means for sensing electromagnetic radiation. The array provides an individually recoverable signal for each sensing means of the array, each signal corresponding to a region of the film. A time sequence of data signals is generated corresponding to the signals generated by the array of sensing means over a period of time in response to radiation focused on the array. The amplitude of the data signals are correlated with the time during which the signals were generated. A periodic pattern in the rate of change of the amplitude of the data signals is identified and at selected time intervals, the rate of change of the amplitude of the data signals is compared with the periodic pattern. A determination is made that the film has been removed if the rate of change of the amplitude of the signals departs from the periodic pattern.

Another preferred embodiment of the invention is a method for determining the rate of change of the thickness of a thin film at a plurality of locations over the area of the thin film, the method comprising the steps of reflecting electromagnetic radiation from the thin film during the time the film is being changed in thickness and focusing at least one selected range of wavelengths of the electromagnetic radiation reflected from the film onto an array of means for sensing electromagnetic radiation which provides an individually recoverable signal for each sensing means of the array, each signal corresponding to a region of the film. A time sequence of data signals is generated, corresponding to the signals generated by the array of sensing means over a period of time in response to radiation focused on said array. The amplitude of the data signals is correlated with the time during which the signals were generated and a periodicity in the rate of change of the amplitude of said data signals is identified. The rate of change of the thickness of the film is determined by relating said periodicity to said selected range of wavelengths. The array may be a CCD according to another preferred embodiment.

Yet another embodiment of the invention is a method for determining the thickness of a thin film at a plurality of locations over the area of the thin film. The method comprising the steps of reflecting electromagnetic radiation from the thin film during the time the film is being changed in thickness and focusing at least two selected ranges of wavelengths of the electromagnetic radiation reflected from the film onto an array of means for sensing electromagnetic radiation which provides an individually recoverable signal for each sensing means of the array, each signal corresponding to a region of the film. A set of data signals are generated corresponding to the signals generated by the array of sensing means in response to radiation of the selected at least two ranges of wavelengths focused on the array. The amplitudes of the data signals are correlated with the wavelength of the electromagnetic radiation from which the signals were generated and compared to a predetermined correlation between amplitudes and film thickness for each wavelength. From this comparison, the thickness of the film is determined.

BRIEF DESCRIPTION OF THE FIGURES

These and other features, aspects, and advantages of the present invention will become better understood with regard to the following description, appended claims and accompanying drawings, where:

FIG. 5 shows graphically the CCD interferometry signal that is observed for etching of patterned polysilicon using the apparatus of the invention shown in FIG. 4, showing the signal for a single CCD pixel and for a 9 pixel (3 by 3 array) averaged signal, centered about the single pixel.

FIG. 6($a$-$b$) shows graphically an FFT spectrum of the observed interferometry signal off FIG. 5, for etching of patterned polysilicon.

DETAILED DESCRIPTION

According to a preferred embodiment of the present invention, a charge coupled device ("CCD") camera is used to measure the optical emission interferometry across a semiconductor wafer. Using the apparatus of the invention, etching rate uniformity is determined in real-time in situ. Spatial and temporal variations in etching rates (and thus selectivity and uniformity) can be determined from the CCD images. The entire surface of a wafer can be monitored using the invention. Analysis points can be chosen before, during and after the etch.

Optical alignment is straightforward. Relatively small optical access ports can be used to image larger wafers, e.g. a fifty mm window can be used to image a two hundred mm wafer.

Figure 4:
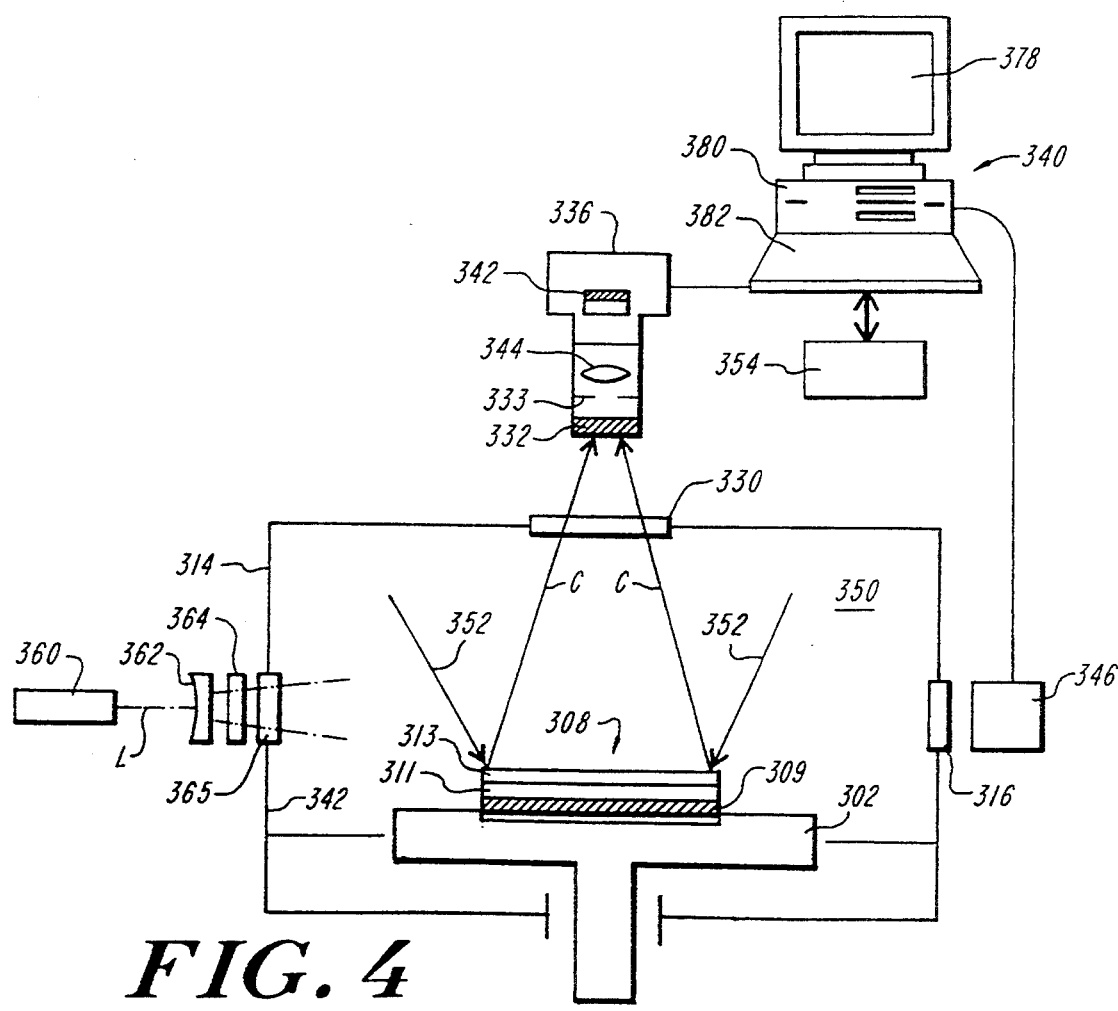
FIG. 4 shows schematically an embodiment of the apparatus of the invention where plasma optical emission is gathered by a CCD camera at one wavelength using a bandpass filter from across an entire wafer with an optional auxiliary light source.

A preferred embodiment of the apparatus of the invention is shown schematically in FIG. 4. A CCD camera 336, such as sold by Electrim of Princeton, N.J., under product designation EDC-1000 HR, and an acquisition board is connected to data processing apparatus 340, such as a 33 MHz 80386 IBM compatible personal computer. The camera 336 includes a CCD array 342 such as sold by Texas Instruments under product designation TC241-22, which has a resolution of on the order of 756×244 pixels (756×488 in interlaced mode). The CCD pixel dimensions are 11.5×27.0 μm and the chip is equipped with an integral quartz cover plate to allow for transmission of light in the UV region of the spectrum. A lens 344, having an appropriate focal length and f-stop capacity, such as a 16-mm focal length f/1.6 C-mount lens, can be used to completely view a one hundred mm diameter wafer 308 through a fifty mm diameter optical viewport 330 that is only 110 mm above the wafer. An iris 333 is adjustable to adjust the amount of light admitted to the CCD. Decreasing the iris aperture increases resolution at the expense of signal strength, and vice versa. A narrow band-pass filter 332 is provided to admit only specified wavelengths of light to the CCD, as explained below.

The camera 336 and lens 344 are arranged relative to the reactor so that the entire surface of wafer 308 is in focus on the CCD array 342, through the smaller standard window 330. The distance between the top surface of the wafer 308 and the lens 344 is approximately 270 mm, and the distance between the lens 344 and the CCD 342 is approximately 17 mm. The window is in the top of a standard plasma reactor chamber 314, having a distance between the window and the wafer 308 of approximately 110 mm. The lens 344 is approximately 160 mm from the window 330. Thus, the film is imaged on the CCD as is typical in a camera, with the relationship among the lens focal length, f, the distance between the lens and the image plane "i" and the lens and the object "o" being defined as follows:

$$\frac{1}{f} = \frac{1}{i} + \frac{1}{o}.$$

Thus, every spot on the wafer within the field of view of the image plane is mapped to, i.e. focused on, a corresponding point on the CCD array. Using this lens, a single pixel on the CCD typically mapped to a surface area of approximately 180×420 μm. Higher resolution of a smaller portion of the wafer can be achieved by changing the relative locations of the lens, the CCD and the wafer, so that a smaller part of the wafer is focused on the CCD.

An advantage of the invention is that the entire wafer 308 can be observed through a standard sized reactor window 330, even though the window is significantly smaller in diameter than the wafer 308. This is very useful, because it is not then necessary to enlarge the window 330 on the reactor 314, which would require custom components for the reactor housing and which is undesirable for the additional reasons set forth above.

The wafer 308 being etched rests inside the reactor chamber 342. Radiation 352 from the energetic plasma 350 impinges upon and is reflected from the upper surface of the upper layer 313 of wafer 308 as explained above in connection with FIG. 1. Because the second layer 311 of wafer 308 is of a different index of refraction than the upper layer 313, the light is reflected from the interface between the upper layer 313 and the second layer 311. Although only two rays of radiation are shown schematically in FIG. 4, it will be understood that radiation is hitting and reflecting over the entire surface area of wafer 308. The wafer 308 is supported by pedestal 302. In a typical etching application, the wafer 308 is a substrate layer 309 of single crystal silicon, having a layer 311 of silicon dioxide on top of it, which is covered by an upper layer 313 of polysilicon. Both the polysilicon and the silicon dioxide layers will be etched away to different degrees in different locations. Actual integrated circuits presently manufactured may include as many as thirty different patterned layers.

Plasma optical emission consists of light having a wide spectrum of wavelengths, ranging from ultraviolet to near infrared. Interferometry can be done at various wavelengths. For OEI of film thickness, shorter wavelengths are more desirable because the spacing between adjacent maxima or adjacent minima, corresponds to a smaller film thickness, as is seen in Equation 4. A narrow optical bandpass filter 332 is used to select the wavelength of light entering the CCD 342. The CCD 342 has an acceptable quantum efficiency for wavelengths between 400 and 850 nm, with a peak near 675 nm. Considering this and the location of strong emissions from the plasma, discussed below, a bandpass filter 332 (such as is available from Andover Corporation of Salem N.H., under product designation P/N 750FS40-25) with a center wavelength of 753.4 nm and a full width half maximum ("FWHM") of 32.0 nm is appropriate.

This filter transmits strong emissions from F (fluorine), Cl (chlorine), Br (bromine) and Ar (argon) a 755.2, 754.7, 751.3 and 750.4 nm, respectively. See, Joseph Reader and Charles H. Corliss, "Part I. Wavelengths" in *United States National Bureau of Standards: Wavelengths and Transition Probabilities for Atoms and Atomic Ions*, (U.S. Government Printing Office, Washington D.C., 1980). The halogens fluorine, chlorine and bromine are common etchant gases present in many plasmas. Argon is used in many plasmas to increase ion bombardment and is frequently added to plasmas for use as an actinometer to determine relative concentrations. Thus, typical radiation from etching plasma is quite intense near 750 nm. Other wavelengths can be chosen for different plasma conditions.

Plasma Etcher and Magnetic Field Synchronization

A reactor suitable for use with the invention, such as sold by Applied Materials of Santa Clara, Calif., under the designation Precision 5000 Plasma Etcher (AME-5000) can operate in a Magnetically Enhanced Reactive Ion Etching ("MERIE") configuration, in which a rotating magnetic field is oriented so that the field lines are parallel to the pedestal 302 surface (perpendicular to the electric field). The magnetic field increases plasma density by decreasing the electron loss rate coefficient. The magnetic field rotates to increase circumferential etching uniformity. This rotating field modulates the plasma intensity, thereby complicating the interpretation of the interferometry signal, which is also modulated due to the etching of a thin film.

The effect of the rotating magnetic field can be removed by synchronizing the image acquisition of the CCD 342 with the rotation of the magnetic field. This insures that data is always taken at the same rotational phase of the magnetic field. This effectively locks the field with respect to the data acquisition. There are spatial variations in plasma emission due to the field, but the cyclic variations caused by the rotating magnetic field are removed from the collected data. Synchronization of data acquisition can be accomplished using a digital Hall effect magnetic field sensor 346 (such as is available from MICRO SWITCH of Freeport, Ill., under product designation #SS21PE) which can be interfaced to the personal computer 340 using a Digital Input/Output card such as is available from Data Translation, of Marlboro, Mass., as product designation DT2817. The personal computer 340 then controls the timing of when the CCD 342 acquires and reads out data, synchronizing those operations to the rotation of the magnetic field.

The data acquisition apparatus may be configured as a suitably programmed general purpose digital computer 340, such as an IBM PC compatible, mentioned above. The computer may be programmed to both acquire and analyze CCD images with software, such as may be written using a high level programing language such as Microsoft C 7.0. Alternatively, a dedicated hardware configuration may be used.

In general, plasma emission will be reflected from the upper and lower interfaces between the upper film 313 and the chamber environment 350 and the deeper layer 311, respectively. At a given moment, the interferences of the incident and reflected light waves produce a net reflection that falls upon the CCD array 342. This reflection constitutes an image of the wafer 308 at a certain time, albeit modulated in intensity due to the interference as described above. A principal advantage of the present invention is that the signal, which includes information about the rate of change of film thickness, also includes information about the position on the wafer of the locations for which the rate information is provided. A true image is provided of the subject film layer 313. Thus, the apparatus of the invention automatically correlates the rate information with the location information. It is not necessary to provide an auxiliary image capture device, or to take pains to make sure that information is only captured from certain spots, such as may be the case with a laser location and illumination technique.

The CCD array 342 transduces the reflected light intensity into electromagnetic signals, which are transmitted to a memory 354 of the data processing unit 340. The memory may be RAM, or auxiliary, such as on a hard disk. The foregoing process of image registration and data acquisition is repeated periodically during the etching process. Variations are possible with respect to what type of memory device is used to collect the electromagnetic signals, and when and what operations are performed on these signals. Typically, the signals are analyzed as they are being collected, and signals from one time are compared to signals from another time. The results of the comparison are displayed on a computer output device, such as a video display terminal, and the operator observes the output, taking whatever action is appropriate.

An auxiliary light source 360, for instance laser 360, and beam expander 362 or a bright white light source, are optional equipment if illumination in addition to the plasma 350 is required. Use of these elements is explained in more detail below.

The method steps of the invention for use with the apparatus of the invention will be explained in more detail with reference to FIGS. 15 and 16.

Figure 15:
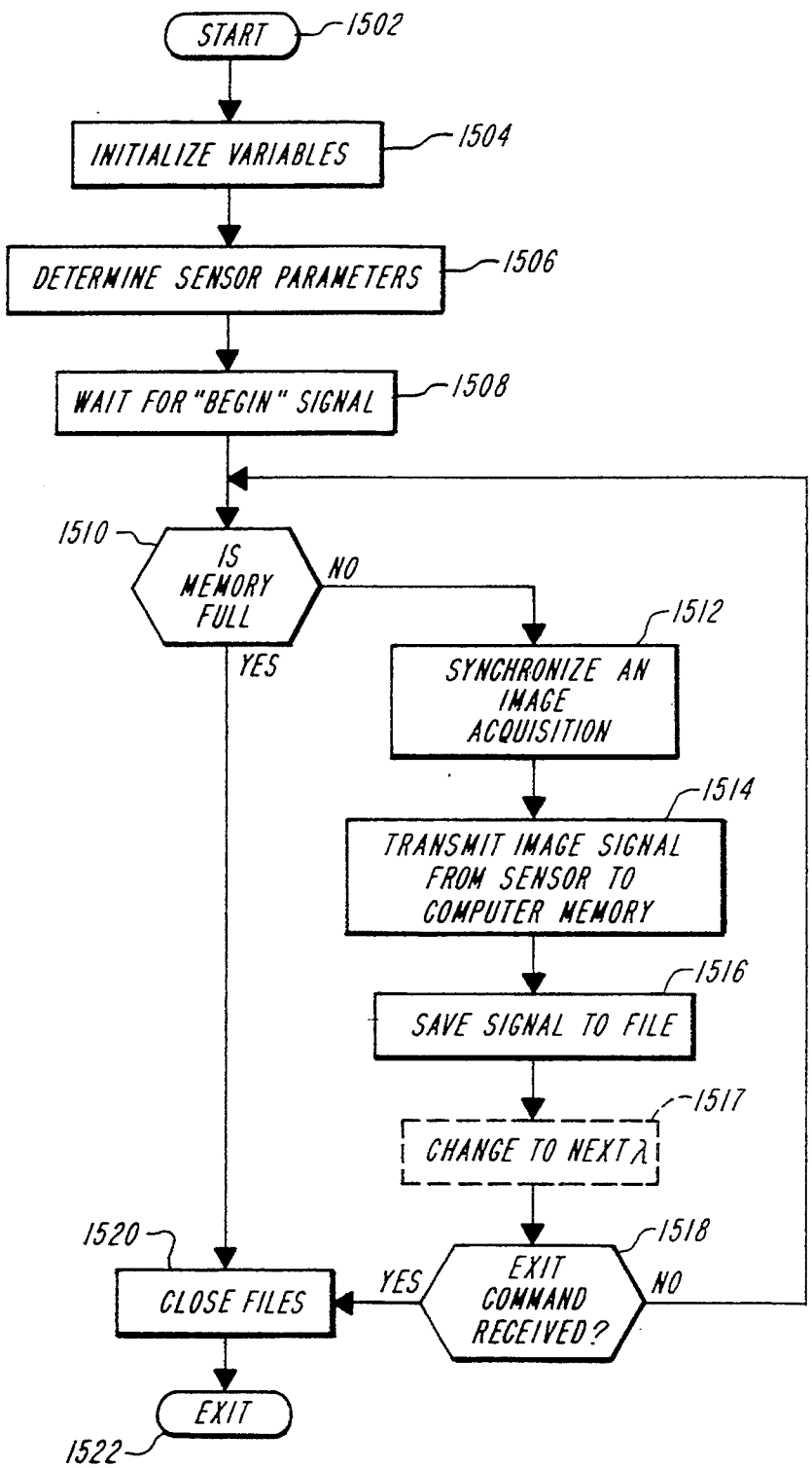
FIG. 15 shows schematically in flow chart form steps of embodiments of the method of the invention for data acquisition and storage.

The acquisition of the data signals representing the interference images of the wafer discussed above is made according to the method steps set forth schematically with reference to FIG. 15. The method begins 1502 and variables used by the data processing apparatus 340 are conventionally initialized 1504. Sensor parameters, such as CCD exposure time, gain, frame rate, etc., are determined 1506 by the user. The data acquisition system then waits 1508 for a "begin" signal. This signal may be actively generated by a user, or it may be automatically generated by the apparatus, such as when the reactor is engaged.

The apparatus of the invention channels data representing the interference images to a memory, such as a 31-megabyte RAM disk in memory 354 of computer 340, to maximize the data collection rates. In a preferred embodiment, one image (non-interlaced) occupies 186,912 bytes (766×244 bytes+8 bytes for time stamp). A 33-MHz 80386 personal computer can achieve a sampling rate (CCD read and data save) of at least 1.46 Hz. Therefore, 169 complete images (representing about two minutes of etching at the maximum sampling rate) can be saved on a thirty-one megabyte RAM disk. Of course, a larger RAM disk could hold more data. The rate of 1.46 Hz is fast enough to suitably resolve the rate of film thickness change for nearly all typical applications, e.g., for etching where film thicknesses are on the order of 1 $\mu$m and etching rates range from about 0.1 to 1 $\mu$m/min.

If the memory is not full 1510 (which it will not be at the beginning of an etch or deposition cycle, unless a problem has arisen) the data processor 340 will synchronize 1512 the acquisition of data by the CCD array 342 with the rotation of the magnetic field (if present), based on signals collected by Hall effect sensor 346, or it will wait until the appropriate time has elapsed between images. The CCD array transmits 1514 the electromagnetic signal that it has transduced from the interference image to the computer memory 354, for instance a RAM disk as discussed above. It will be understood that the data being transferred represents an image of the entire wafer, or entire viewing area selected, for a single instant in time. It is prudent to save 1516 the signal to a second memory file, such as a hard disk memory file, which is more resistant to data loss than is a RAM disk. The data that is stored in the RAM disk will be used, as explained below, to determine the etching rate. (The step 1517 shown in dotted outline is not part of the method of determining etching rate, and is part of a related method of the invention for determining absolute film thickness discussed below.)

If an exit command has been generated 1518, such as by the user, or by an automatic command generated at a predetermined stage in the etching process, the data processor 340 conducts the step 1520 of closing the data files and the data acquisition portion of the method of the invention ends 1522. If no exit command has been received 1518, the data processor 340 returns and tests the memory full condition step 1510.

If the memory is full, then the data acquisition portion ends. (If the memory is full, yet it is necessary to collect more data to properly analyze the situation, then more memory must be provided to the apparatus of the invention.) If the memory is not full, the data processor 340 again synchronizes 1512 the acquisition of an image and transmission 1514 of the signal representing that image to the computer memory 354, as above. The process continues, until either an exit command is reached 1518 or the memory 354 becomes full.

Turning now to the steps of the method used to analyze the data acquired as above, the apparatus of the invention is able to analyze regions of various shapes and sizes, including the entire wafer 308, an entire die (a sub region of a wafer), a line on the wafer and/or individual points. The steps conducted by the data processor 340 under the control of suitable analysis software are shown schematically in FIG. 16. The process begins 1602 and variables used by the processor are initialized 1604. The processor 340 displays 1605 an image of the wafer 308 on a computer display 378. The image is generated by the CCD, which generates a signal based on the light reflected from the wafer to the CCD. The user is able to select 1606 regions to be analyzed from the image, using an input/output device, such as a mouse-based video screen interface, such as may be conventionally designed by one of ordinary skill in the art. If the user is interested in analyzing the entire wafer, a simple command is issued, and approximately 700 spatial locations are analyzed as discussed below. Analysis of such a large number of locations is not readily within the capability of a personal computer, such as specified above, and a faster, more powerful data processor is beneficially used, such as provided by MIPS of Sunnyvale, Calif., under product designation M120/5. However, it is often sufficient to analyze only a relatively small number of points, such as ten. In such a case, the personal computer is adequate.

The etching rate can be calculated in batch, after a test wafer has been etched, or in real-time as a test wafer or a process wafer is being etched. If the method steps are conducted in batch mode, then all of the data acquisition and save steps illustrated in FIG. 15 are conducted before any of the data is analyzed. The data resides on the RAM disk, or some other memory media. However, if the real-time mode is adopted, the analysis steps are conducted immediately after the apparatus of the invention has acquired the minimum amount of data required to be analyzed. Then, the analysis proceeds in a rolling fashion, operating on more and more data (i.e. data for subsequent moments in time), until all of the data has been collected and analyzed. Alternatively, the total time may be divided into several segments and analyzed separately, e.g. into two to ten periods.

The batch mode is simpler to describe, and it will be used for the illustration of the basic method. However, the real-time mode is also an embodiment of the invention, and is discussed in less detail following the discussion of the batch mode.

The data values, for each point, are correlated 1608 with the time, for each moment in time throughout the analysis period. From among all of the time-correlated data values, the data for the time period of interest are identified 1610 for analysis.

Occasionally, the observed CCD signal shows a linear increase in absolute signal intensity with time. This same effect has also been observed in conventional laser interferometry and in interferometry simulations. This is due to the finite (non-zero) absorption coefficient of silicon in the visible wavelengths. As the polysilicon film thins due to etching, the remaining thinner film reflects more light This is in contrast to surface roughening of polysilicon which is known to decrease the signal intensity with time. To reduce the affect of linear drifts in the signal, the data were fit 1612 to a straight line. This line was subsequently subtracted from the observed CCD signal. If this was not done, the treated data was sometimes dominated by the linear rise in the CCD signal and the etching rate could not be determined.

Etching Rate Calculation

The etching rate was calculated using Equation 6, with $\Delta d_{film}$ being calculated from Equation 3. The angular correction factor from Equation 5 was calculated at each spatial analysis point. This correction was very small; the maximum correction factor being less than 0.2% for polysilicon and less than 0.9% for silicon dioxide for a 100-mm wafer with the CCD system used in these experiments. Polysilicon's large index of refraction (3.42 versus 1.5 for silicon dioxide) results in a smaller correction factor as light is bent more towards the surface normal.

The time between maxima or minima in the CCD interferometry signal is determined by computing 1614 a temporal Fast Fourier Transform (FFT) analysis with a decimation-in-time algorithm. See, William H. Press, Brian P. Flannery, Saul A. Teukolsky & William T. Vetterling, *Numerical Recipes* (Cambridge University Press, New York, 1988). The FFT algorithm requires the number of data points to be an integral power of two. Thus, the interferometry signal is padded with zeroes to increase the size of the data set to meet the FFT algorithm's requirements. Further zero padding is used to increase the number of Fourier components computed in the spectrum (allowing greater resolution of the peak frequency) at the expense of additional computation time and memory usage. The dominant frequency, $f_{max}$, is the dimensionless frequency at which the FFT amplitude is a maximum. This frequency is determined 1616 and the etching rate is calculated 1618 directly from the FFT as:

$$ER = \frac{\lambda}{2n_2\cos(\theta_2)} *SR*f_{max}, \quad (7)$$

where SR is the sampling rate for the CCD. The FFT frequency range is nondimensionalized such that the transform is evaluated between frequencies of 0 and 0.5 (the Nyquist frequency). The results are displayed 1620, for instance on the video display terminal controlled by data processor 340. The display can show varying etch rates by intensity of a specified color, or changes in color, or black and white patterns, depending on the capabilities of the display and the needs of the process controlling tasks. The etch rate results are then saved 1622 for further use.

If the real-time computation mode is conducted, the data processor 340 waits for the minimum period of time necessary to provide enough sampling points to resolve a full interference cycle, and then determines 1610 the temporal beginning and end of the period for analysis 1610 and then conducts the linear rise normalization 1612, FFT computation 1614, $f_{max}$ determination 1616 and etching rate calculation 1618 step. A minimum of four or five points within a cycle are needed. (The steps 1619 and 1621 shown in dotted outline are not part of the method of determining etching rate, and are part of the related method of the invention for determining absolute film thickness discussed below.) The results of the analysis are displayed 1620 and saved 1622. After the display 1620, the processor evaluates 1626 whether the temporal endpoint for analysis has been reached. If not, it returns and again determines 1608 the data values vs. time at each analysis location for the additional moments in time for which data has been acquired by the CCD array and processor 340. This data is used to perform the analysis steps discussed above, again, the results of which are also displayed and stored. The processor continues to perform such calculations until it evaluates 1626 the temporal endpoint for analysis and determines that the temporal endpoint has been reached, in which case it exits 1624 and the process is concluded.

EXAMPLES

Etching rate determinations were conducted using a 5000 Å thick layer 313 of undoped polysilicon over a 1000 Å thick layer 311 of silicon dioxide on 100-mm wafers 309. Both blanket polysilicon wafers and wafers patterned with 10,000 Å of photoresist, such as Kodak brand KTI820 were used. Etching was done on an AME-5000 reactor using HBr and $Cl_2$ at 10 and 30 sccm, respectively. Pressure was 100 mTorr; power was nominally 250 Watts, measured at the generator. The cathode temperature was 20° C., except where noted. Magnetic fields of 0 and 75 Gauss were used. A magnetic field rotation frequency of 2 Hz was used.

The signal-to-noise ratio in the observed CCD signals was measured by observing a non-eroding region of the process chamber during an etching run. The standard deviation of the observed CCD signal was 0.51 out of 256, or 0.2% of the full scale signal. To compare the etching rate determined by the CCD technique with that determined by helium-neon laser interferometry, one site on the wafer was analyzed using both techniques simultaneously. The etching rates determined by both techniques were always within six percent of each other, and often much closer. The difference was mainly caused by the interpretation of the waveforms by FFT analysis.

Noise in the CCD signal (FIGS. 5, 7 and 8) is thought to be caused primarily by light scattering within the etching chamber 314 and not from the CCD camera 336 or plasma fluctuations.

Light which is scattered from the wafer 308 at any time before entering the collection optics (filter 332, lens 344 and CCD array 342) can exhibit temporal fluctuations caused by thin film interferometry and off-angle scattering from non-planar surface features. Laser illumination, which eliminates much of the multiple scattering pathways, exhibits a much better signal-to-noise ratio.

The number of pixels used in the analysis (size of analysis area) affected only the appearance of the time-domain interferometry signal. Shown in FIG. 5 is the observed CCD signal for patterned polysilicon etching for a single pixel (squares, dotted line) and for a 9-pixel average (open circles, solid line), centered about the location of the single pixel. Spatial averaging improves the signal-to-noise ratio of the time domain signal. The frequency-domain content was essentially unchanged by spatial averaging except at very high frequencies, which did not change the etching rate computation.

FIG. 6 shows the Fast Fourier Transform (FFT) magnitude spectrum for the two CCD signals of FIG. 5. The dashed line is for a single pixel and the solid line is a 9-pixel average. Frequencies from DC to the Nyquist frequency are plotted. The insert shows a detailed view of the region of interest for etching rate calculation. The 9-pixel average shows a very slight shift in the location of the maximum, which changed the etching rate by 1.1 percent. Such differences in the maxima were vanishingly small on unpatterned polysilicon (FIG. 7) which showed much better signal-to-noise ratio and no significant deviations between the single-pixel and the 9-pixel analyses.

Figure 8:
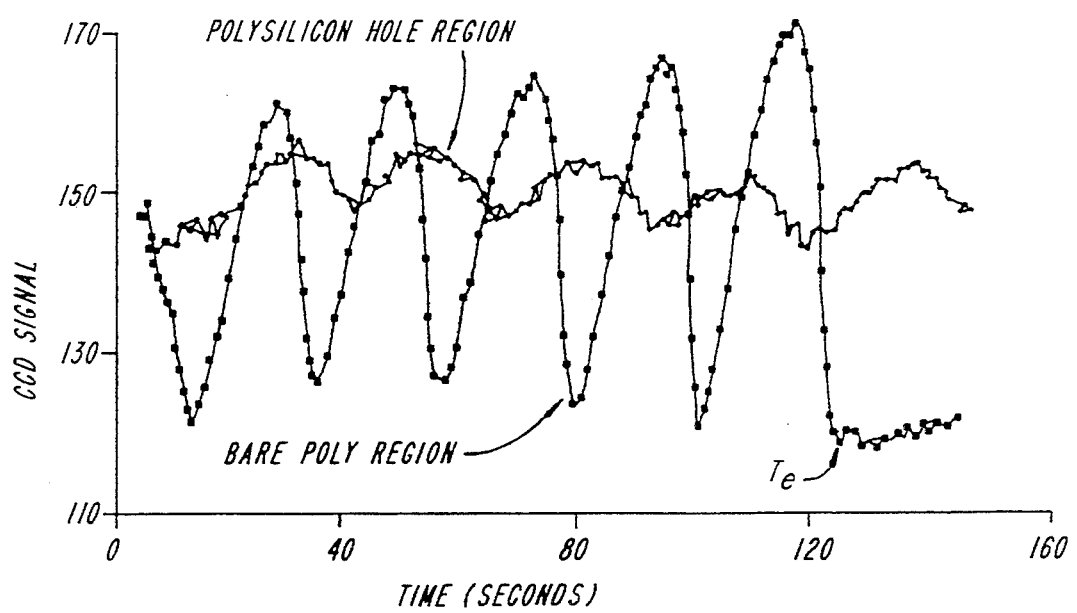
FIG. 8 shows graphically an interferometry signal for polysilicon measured by an embodiment of the apparatus of the invention for both a bare polysilicon region and a region patterned with photoresist to produce an array of holes.
Figure 9:
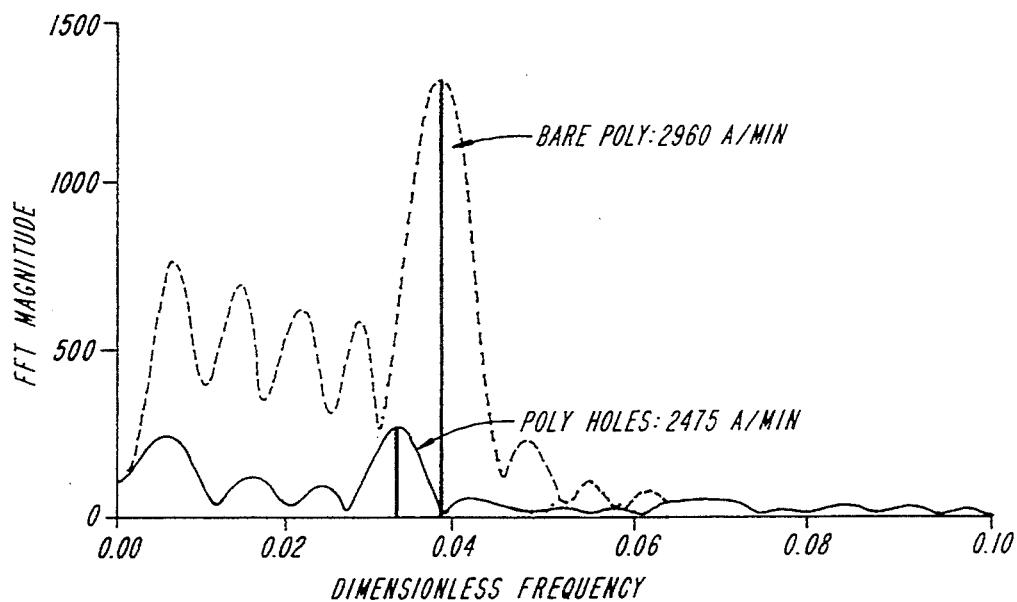
FIG. 9 shows graphically the magnitude of the FFT for the signals shown in FIG. 8.

The interferometry signal from a polysilicon etch over a 3×3 pixel area (approximately 450×1050 μm) is shown in FIG. 8 for both a bare polysilicon region (widely fluctuating curve) and a region with an array of holes in the resist masking the polysilicon (narrowly fluctuating curve). Both regions are located on the same die. A different periodicity is observed for the two different regions, indicating a difference in etching rate. FIG. 9 shows the magnitude of the FFT for these two signals. Etching rates were determined to be of 2960 Å/min. for the bare polysilicon (dotted line) and 2475 Å/min. for the patterned polysilicon hole region (solid line). This observed difference in etching rates is a direct observation of pattern dependent etching, where the etching rate depends upon the local topography.

Rather than using the magnitude of the FFT frequency components to analyze the timing of the maxima or minima, the phase of the FFT frequency components may correlatively be used, as would be understood by one of ordinary skill in the art. The FFT magnitude spectrum is used to determine interferometry periodicity and thus etching rate and etching rate uniformity. The FFT phase spectrum can be used to determine film thickness uniformity across a wafer, by comparing the phase shift at multiple locations across the wafer. Further, by comparing initial phase variations across the wafer, the initial film 313 thickness uniformity may be determined.

Figure 10A:
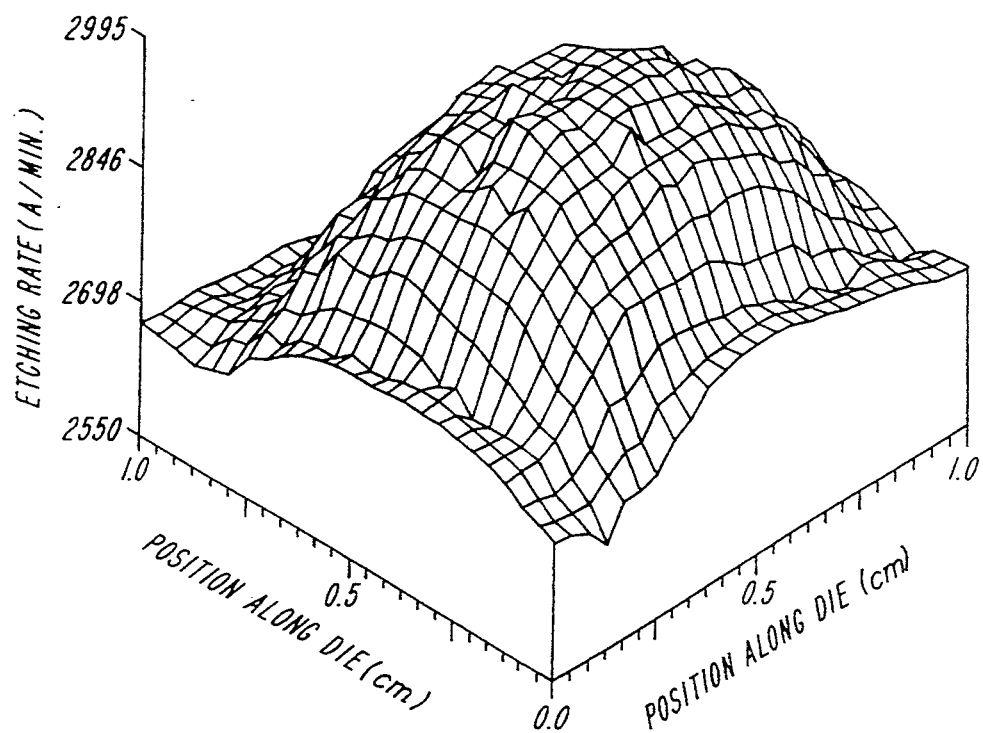
FIG. 10A shows graphically by a surface plot the etching rate measured across a blank polysilicon die, surrounded by photoresist, using an apparatus of the invention.
Figure 10B:
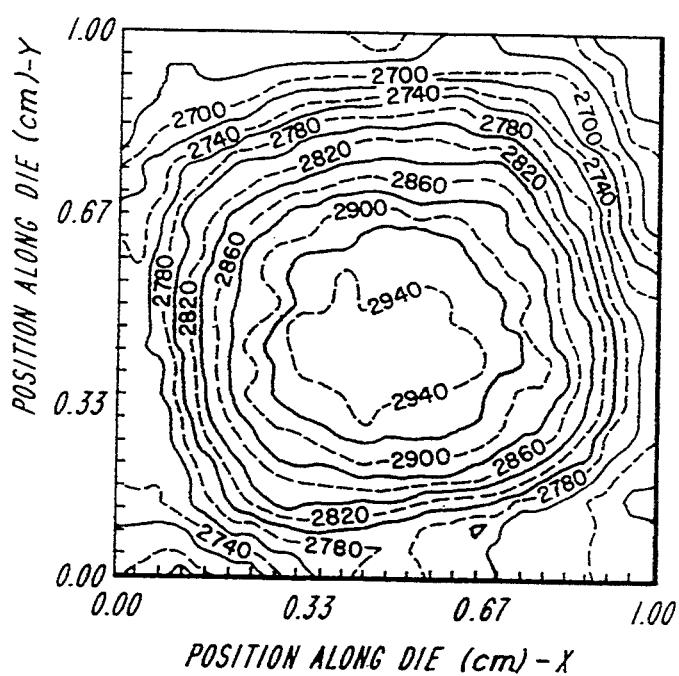
FIG. 10B shows graphically by a contour plot the etching rate shown by the surface plot in FIG. 10A.

FIG. 10A shows a surface plot of etching rate across an unpatterned one cm square polysilicon die surrounded on three sides by photoresist. This die occupies only a small part of a larger wafer. The etching rate is charted on the vertical axis, in Å/min. The etching rate shows a dome-like structure, with etching rate highest in the center of the die and lowest near the edges. FIG. 10B shows a contour plot of etching rate on the same die. The etching rate varies between 2950 Å/min. at the center and about 2650 Å/min. at the edge. The lower etching rate near the edges may be due to micro loading, where the etchants are consumed on the photoresist around the die. Alternatively, the difference could also be caused by the deposition of photoresist products which passivate the polysilicon near the photoresist.

All the blanket polysilicon dies on the wafer showed a similar dome-shaped etching rate. The location of the maximum was typically at the center, but was skewed towards the edge of the wafer on dies located near an extreme edge of the wafer. This was caused by the combination of a dome-shaped etching rate across the die and a sharply higher etching rate towards the edges of the wafer (discussed below).

Figure 11:
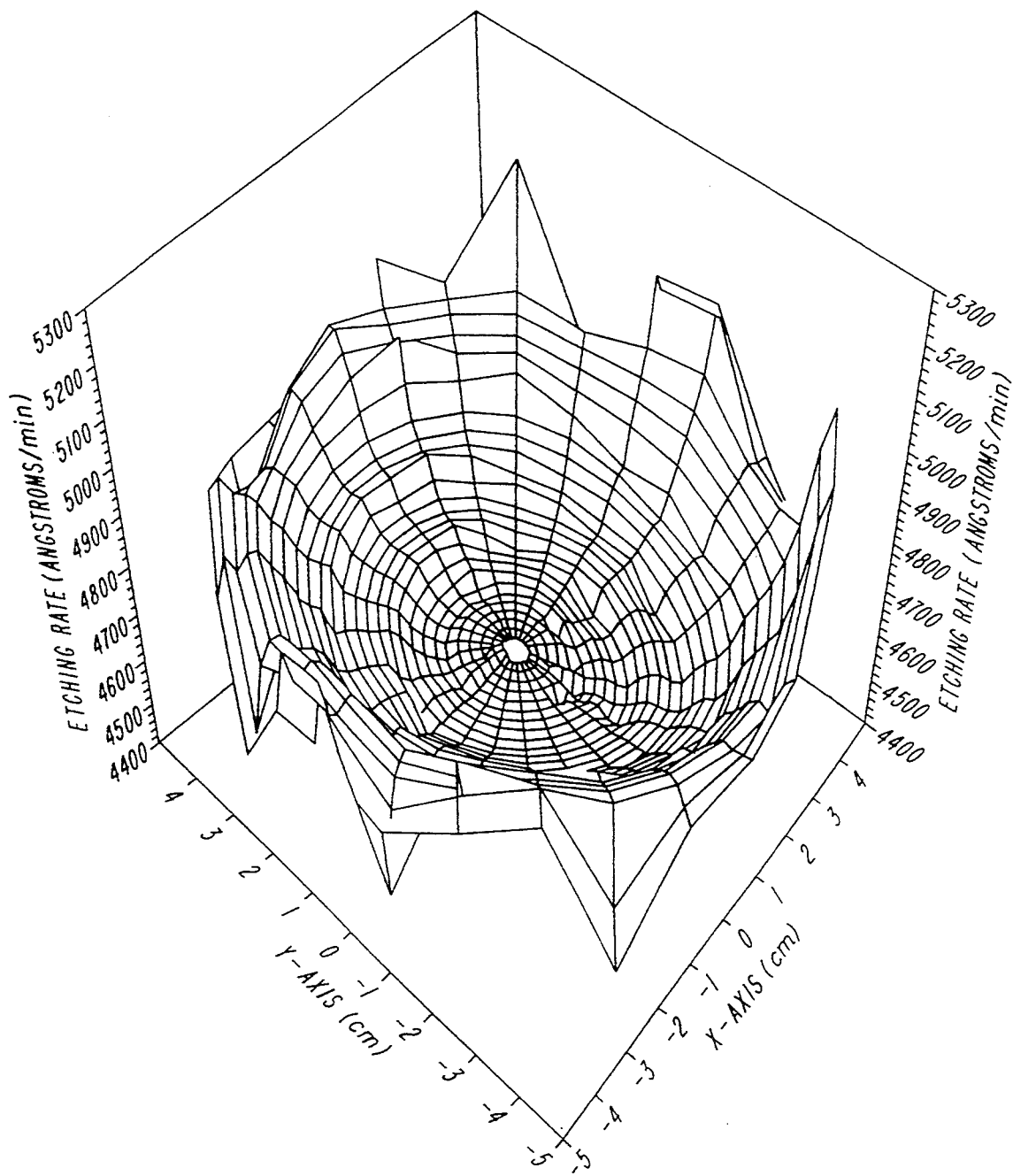
FIG. 11 shows graphically the etching rate measured using an apparatus of the invention across a blanket polysilicon wafer, with no magnetic field.
Figure 12:
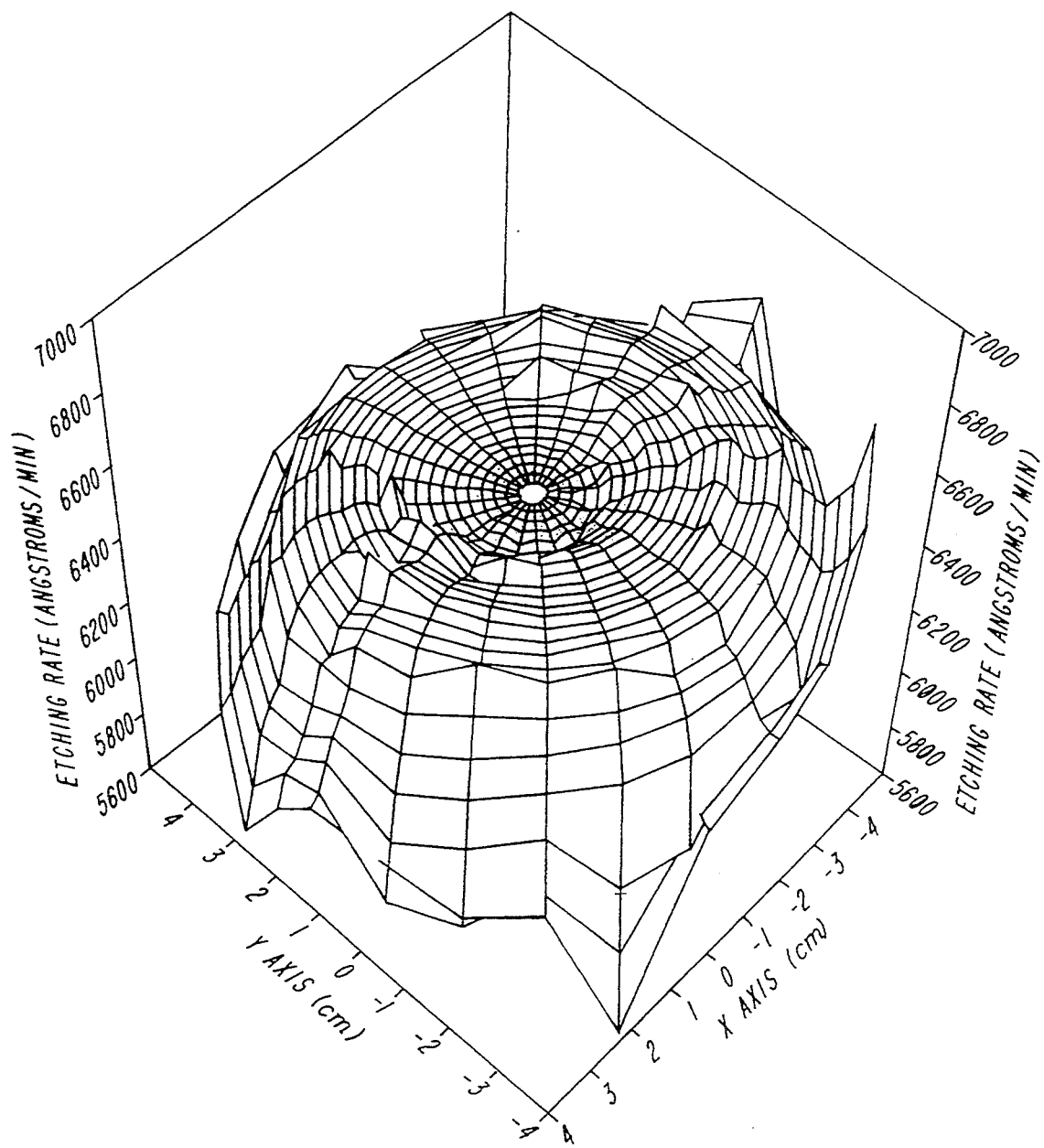
FIG. 12 shows graphically the etching rate measured using an apparatus of the invention across a blanket polysilicon wafer, with a magnetic field.

Etching rates across an entire wafer can be measured, yielding uniformity. FIG. 11 shows a surface plot of polysilicon etching rate across an unmasked 100-mm polysilicon-covered wafer etched using no magnetic field, while FIG. 12 shows the same surface for a wafer etched with a 75 Gauss magnetic field revolving at 1 Hz. A large difference can be seen between the two responses. In the first case, without a magnetic field, (FIG. 11) the etching rate is lowest in the center, and increases radially outward. With the magnetic field turned on, (FIG. 12) the etching rate decreases radially outward. Also visible in these plots is the effect of the quartz clamp ring used to hold the wafer on the pedestal. There is a large drop in the etching rate where the fingers on the clamp ring touch the wafer, as seen on the edge of these surface plots.

Figure 13:
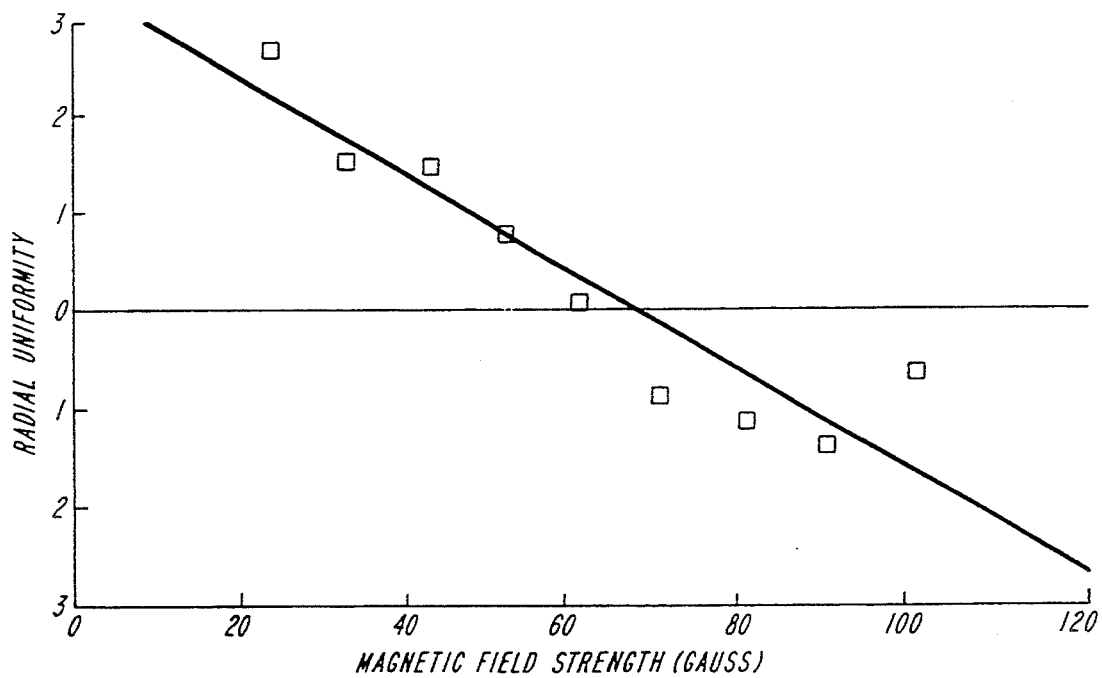
FIG. 13 shows graphically the effect of magnetic field strength on radial uniformity of etching rate.

The clearing pattern seen in FIG. 11, etching fastest at the edge and slowest at the center, has been termed a "bullseye" pattern. See, D. A. Danner, M. Dalvie, and D. W. Hess, "Plasma Etching of Aluminum: A Comparison of Chlorinated Etchants," *J. Electrochem. Soc.* 134(3), 669 (1987). Danner et al. attributed this pattern in $BCl_3/Cl_2$ etching of Al to the diffusion of reactants through a mass transport boundary layer. Giapis et al. also observed this "bullseye" clearing pattern in the etching of AlGas/AlAs with $BCl_3/Cl_2$ at 27° C. See Konstantino P. Giapis, Geoffrey R. Scheller, Richard A. Gottscho, William S. Hobson & Yong H. Lee, "Microscopic and Macroscopic Uniformity Control in Plasma Etching," *Appl. Phys. Lett.* 57(10), 983 (1990). Since the "bullseye" pattern was caused by the surface reaction rate coefficient exceeding the transport rate coefficient to the surface, the non uniformity could be decreased by lowering the wafer temperature to −40° C. and thus, lowering the surface reaction rate coefficient. The $HBr/Cl_2$ chemistry used to etch undoped polysilicon on the AME-5000 did not show the same temperature effects. The change in the uniformity profile for polysilicon etching on the AME-5000 as magnetic field strength varies indicates that the "bullseye" pattern is being formed by differences in the plasma density across the wafer. The effect of magnetic field strength on uniformity across a wafer is shown in FIG. 13. At a magnetic field of about 65 Gauss, etching with the least radial non uniformity is obtained.

For viewing a small area, rather than using the lens identified above, a longer focal length lens 344, such as a Computar 50-mm f/1.3 lens, can be used for a detailed view of etching rates across a single 1 cm×1 cm die. In this case, a pixel on the CCD typically maps to a surface area of 27×63 μm, rather than the 180×420 μm for the lens identified above. Further, pixel resolution can be improved by using a higher resolution CCD 342 such as one with 1024×1024 or 2048×2048 pixels.

For viewing a wider area, a wider angle lens 344 can be used, such as a 4.8-mm f/1.8 lens, to observe a 200-mm wafer 308 through a 50-mm viewport 330. Thus, it will be understood that using the CCD provides the investigator with an image of the subject wafer within a wide range of useful resolution. Further, using a CCD provides a very large number of individually recoverable data points, each of which can be mapped to an identifiable and relatively small region of the subject film. The regions may be small enough, given appropriate selection of lens and positioning, to analyze most regions of any practical interest under present processing practices.

Rather than the narrow band pass filter 332 specified above, it is also possible to use a type of narrow band pass filter known as a near-UV filter (404.7 nm) in order to observe smaller changes in film thickness. However, typical plasma emission may not be strong enough for interferometry to be observed with the CCD specified above. In such a case, it may be beneficial to use a different plasma, with a stronger emission in UV, or an intensified CCD having more UV sensitivity.

Figure 17:
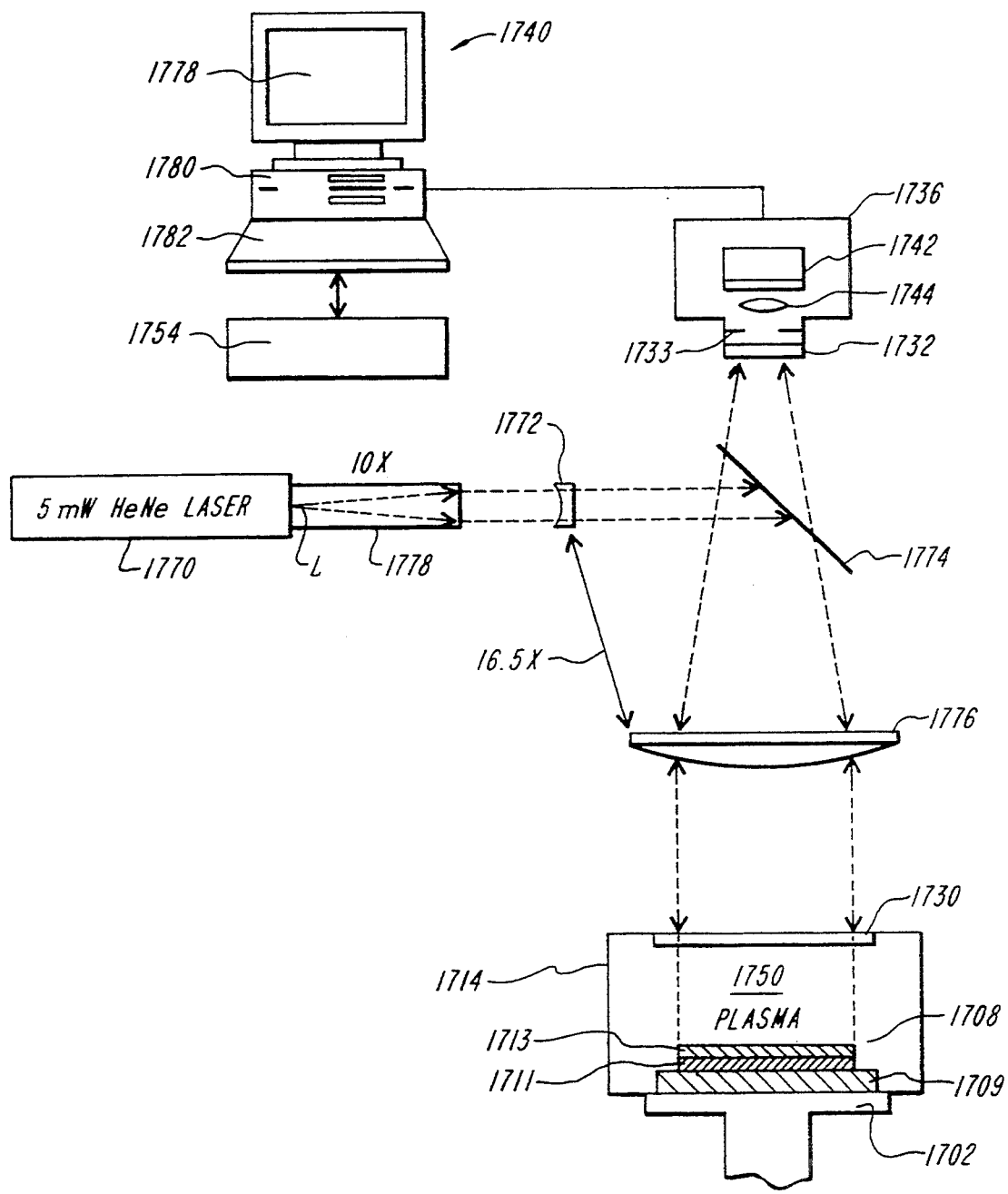
FIG. 17 shows schematically an embodiment of the apparatus of the invention which uses a collimated laser beam to illuminate the subject film, rather than plasma emission.

Rather than using the plasma emission as the illumination source, the apparatus of the invention can be implemented using a laser to perform laser interferometry over the entire surface area of the wafer. The apparatus used for this embodiment of the invention is shown schematically in FIG. 17. An 0.8-mm ($1/e^2$ diameter) beam "L" from a 5 mW HeNe laser 1770 is expanded by a factor of 10 using a beam expander 1778 having a low spherical aberration. The beam is expanded again, by a factor of about 16.5, such as by using a combination of a diverging lens 1772 and a converging lens 1776 with a focal length ratio of 1:16.5. A plate beam splitter 1774, placed between the diverging lens 1772 and the converging lens 1776, directs half of the beam toward the wafer 1708. The other half is transmitted through the beam splitter and is not used.

A window 1730 is provided above the wafer 1708, in the reactor 1714. The window is a custom 3.5 inch window.

A CCD camera 1736 is provided, having a CCD array 1742 arranged to receive reflections of the expanded laser beam L, reflected after expansion from the interfaces of the wafer 1708 between the environment 1750 and the upper layer 1713, and the upper layer 1713 and the lower layer 1711, as described above in connection with the plasma-only embodiment of the apparatus of the invention. A data processor 1740, such as described above, controls the CCD array 1742. A bandpass filter 1732, such as at 632.8 nm blocks light other than that of the reflected laser beam from being received by the CCD array 1742. A lens 1744 focuses the received light onto the CCD array 1742, and an iris 1733 regulates the amount of light admitted.

Thus, the laser beam is expanded to a diameter to illuminate the full surface area of the wafer 1708, and is directed to reflect from the wafer 1708, back through view port 1730, lens 1776, beam splitter 1774, to encounter CCD array 1742. The arrangement of the expander 1776 and diverging lens 1772, with the converging lens 1776 being traversed twice and the diverging lens 1772 being traversed once minimizes the spherical aberration (and resultant loss of resolution of the optical system. It also allows varying the spatial resolution of the apparatus by moving the CCD array 1742 relative to the converging lens 1776, since the light is weakly converging as it approaches the array.

In the embodiment described, the laser beam L is expanded by a net factor of approximately one hundred sixty-five. This increases its $1/e^2$ diameter from 0.8 mm to 132 mm, which is near the optimum for maximizing the beam intensity at the edge of a 100 mm wafer. The optimum is $\sqrt{2}$ times the wafer diameter. The laser intensity will be decreased by a factor of about $165^2$, however, even accounting for losses along the optical path, this is still about ten times brighter than the light emitted by a typical processing plasma at 632.8±0.5 nm wavelength (using a 1 nm bandwidth laser line filter 1732). The sensitivity of the CCD 1742 is high enough that the required exposure time will be only about 30 ms, which will not limit the frame acquisition rate.

The spatial resolution of a typical implementation of this laser embodiment of the invention is the same as for the embodiment without the laser. This is more than sufficient for monitoring uniformity of etching rate, and allows measuring etch rate variations within a single die, which is typically 1 cm. square. It is possible to capture at least the 1.46 frames per second mentioned above.

It will be observed that, if plasma emission is used to illuminate the wafer, it is not necessary that the observation window 330 be directly above the wafer 308. What is required is that there be a line of sight from every point on the wafer 308 to a corresponding active site on the CCD array 342.

An alternative embodiment of the invention uses the plasma emission as shown in FIG. 4, further enhanced with a laser or bright lamp. For instance, as shown in FIG. 4, a laser 360 emits a beam L, which is passed through a diverging lens 362 and a diffuser 364, such as frosted glass into a port 365 into the etching chamber. Multiple reflections inside the chamber result in relatively uniform illumination of the wafer. If two chamber ports are available, this embodiment is easily implemented. It permits high resolution and signal to noise ratio. No difficult alignment issues arise, as may be the case with the laser embodiment of FIG. 17. It should be noted that the signal to background ratio of this embodiment is likely to be lower than that of the laser alone embodiment of FIG. 17, due to scattered laser light that reaches the CCD array 342 without reflecting from the wafer 308. However, it is believed that the signal to noise ratio will still be higher than for the plasma only embodiment illustrated in FIG. 4.

It is not necessary that the auxiliary light source be a laser. This is because a narrow beam of light is not needed. What is needed is an intense light. Other sources that will provide such light are also appropriate.

The foregoing descriptions have concentrated on the thin film removal process of plasma etching semiconductor wafers. The apparatus and method of the invention can be modified in a straight forward manner for any other similar film removal processes.

Similarly, the apparatus and method of the invention can be directly applied to processes that apply material to thin films, such as: CVD, PECVD, sputter deposition, thermal deposition, evaporation, thermal processing, physical vapor transport, etc.

Figure 7:
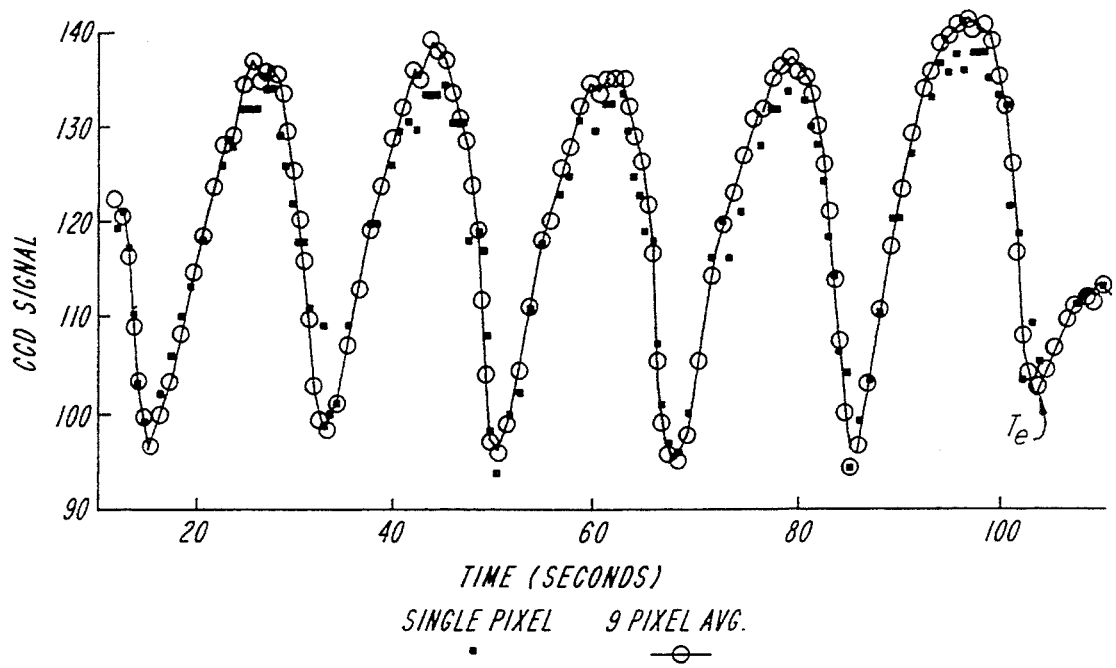
FIG. 7 shows graphically CCD interferometry signals for etching of unpatterned polysilicon, observed using an apparatus of the invention, showing the signal for a single CCD pixel and for a 9 pixel (3 by 3 array) averaged signal, centered about the single pixel.

In addition to determining etching rate over a large area, the apparatus of the invention can be used to determine various conditions relating to the endpoint of a film removal process, such as wafer etching. As shown in FIG. 7, the etching of a layer of a characteristic reflectivity generates a periodic variation of intensity. For instance, the material being etched gives rise to an extremum approximately every eighteen seconds, and the amplitude of the maximum is at approximately 140 display units. At a time $T_e$ of approximately 105 seconds on the horizontal axis, a definite change in the shape of the CCD signal curve can be observed, with the slope decreasing markedly from that previously observed following a minimum. This change in slope signifies a change in the substance being etched away. That means that the surface layer has been completely etched away at that location, and endpoint has been reached. If the CCD signal were captured for a longer period of time, it would likely be observed that the period between extrema would change, as well as the amplitude of variation.

It should be noted that end point times vary across a wafer, and across different surface features. For instance, FIG. 8 shows the simultaneous etching of two different types of layers at different locations on the same die. A polysilicon hole region gives rise to a signal that varies over a period of about thirty seconds, with an amplitude of only about 155 units. A bare poly region displays a period of about twenty seconds, but with a much larger amplitude of about 170 units. Further, the slope between adjacent minima and maxima differs greatly for the two curves. The endpoint at time $T_e$ for the bare polysilicon clearly occurs at about 130 seconds, while no noticeable endpoint has yet occurred for the polysilicon hole region at 150 sec.

Thus, the endpoint of an etching stage can be established using optical techniques only, without analyzing the chemical composition of the plasma. Further, using the apparatus of the invention, the endpoint related state at many locations over the wafer, or even the entire wafer, can be determined. Thus, the designer may choose to allow the process to go beyond endpoint at certain locations, to ensure that endpoint is reached at other locations of a different criticality. While so doing, the designer has accurate knowledge as to the effects of continuing the process. Further, the designer will have an accurate understanding of the degree to which the process has gone beyond. Thus, it is not necessary, as in the prior art, to make judgments about the entire wafer based on endpoint measurements at either a single spot, or a small number of spots, such as with laser interferometry. Similarly, it is not necessary to make judgments about critical wafer locations based on average endpoint measurements over the entire wafer.

Figure 18:
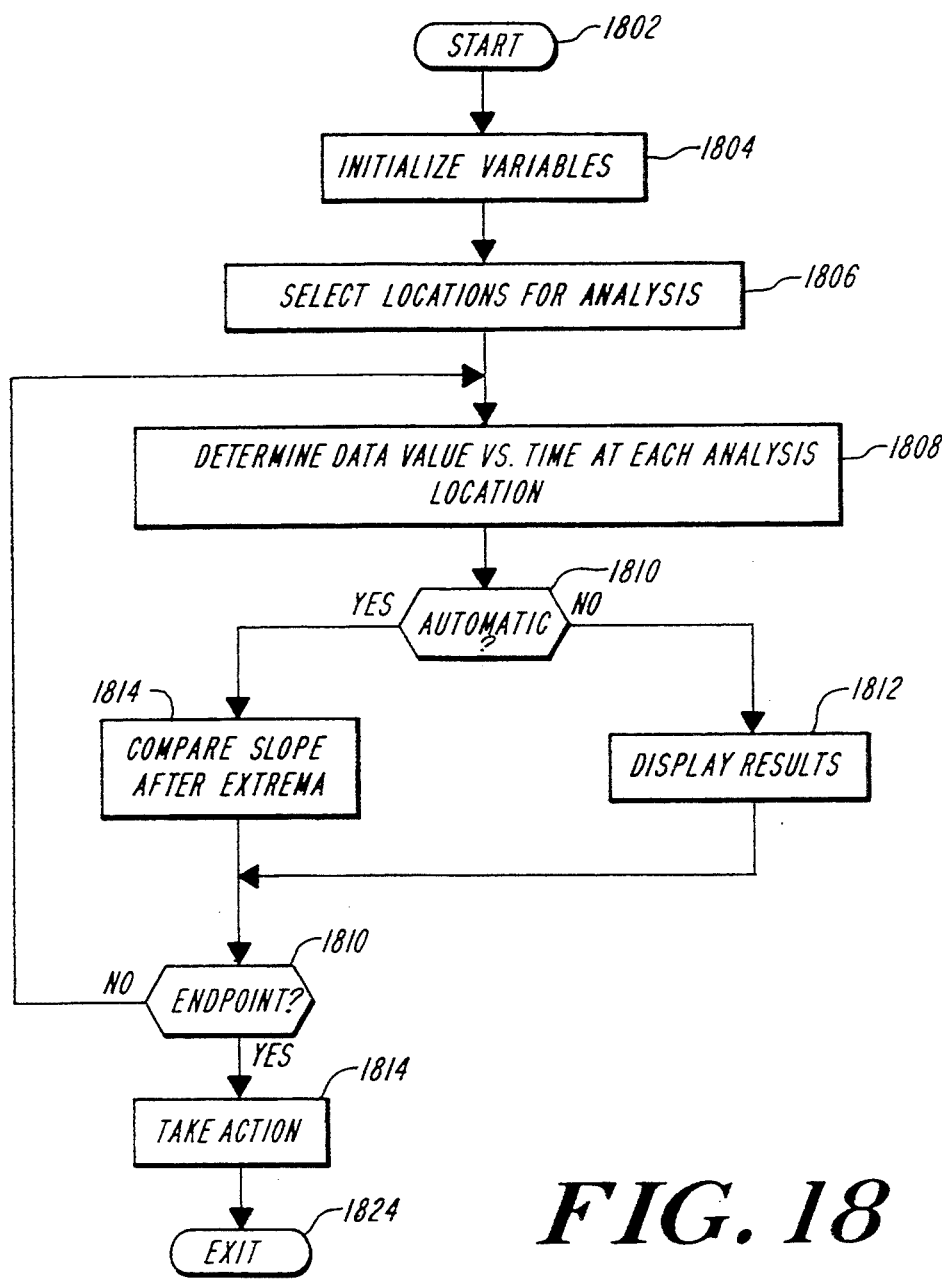
FIG. 18 shows schematically in flow chart form steps of an embodiment of the method of the invention determining the end point of an etching process.

The analysis steps of the method of the invention to determine endpoint are shown schematically in FIG. 18. The process starts 1802 and variables are initialized 1804. As in the rate determination aspect of the invention, locations are selected from analysis 1806. Next, the data values, which have been stored in computer memory for a batch implementation, or which are being collected and delivered to the processor in real-time for a real time implementation of the invention, are matched 1808 to the time at each analysis location. Next, the results are displayed 1908. The results can be displayed 1812 such as in FIG. 8, in a graphical format. If so, the operator looks for the change in the slope of the CCD signal after an extremum, such as a minimum, in order to make his process control decisions. Rather than a display such as shown in FIG. 8, the process can be automated 1810, and analysis can be performed 1814 on the data to arithmetically compare the slope after an extrema to the slope experienced before, and a condition for endpoint will be tested 1814. If endpoint has been reached, as evidenced by the slope diverges from the previous slopes by more than a control value, certain action will be taken 1814, such as stopping the etching process.

The apparatus of the invention can also be used to determine the end point of a process for removing material that is not transparent with respect to the electromagnetic radiation in the environment, by observing reflectivity, rather than interference effects. For instance, if a layer of metal that is opaque to the radiation is being removed, it can be observed using the apparatus of the invention. Because the metal is opaque, there will be no reflection of radiation from the interface between its lower surface and whatever substrate supports the metal. However, the metal reflects the radiation to a certain degree, and this degree is observable in the amplitude of the light received at the CCD. When the metal layer is completely removed, the radiation will reflect from the next layer, which has can be provided such that it has a different reflectivity. Thus, the amplitude of the reflected radiation will change when the metal layer is removed at any given spot. This change can be observed in the same manner as can be the change in etching rate, and slope of the interference signal discussed above. Thus, the apparatus and the method of the invention can be used to determine endpoint of metal removal processes. It should be noted that for this application, the metal layer need not be thin.

The various embodiments of the invention discussed above can be used to determine the rate of change of film thickness between two points in time or the degree of difference between film thickness using phase shifts. However, it is not possible to use these embodiments to determine absolute film thickness, unless the thickness at the starting point of observation is known. The original thickness of a film is often not known. It is useful to be able to know the absolute thickness, for instance when etching a film of unknown or non uniform thickness where it is desirable to identify the endpoint.

Figure 14:
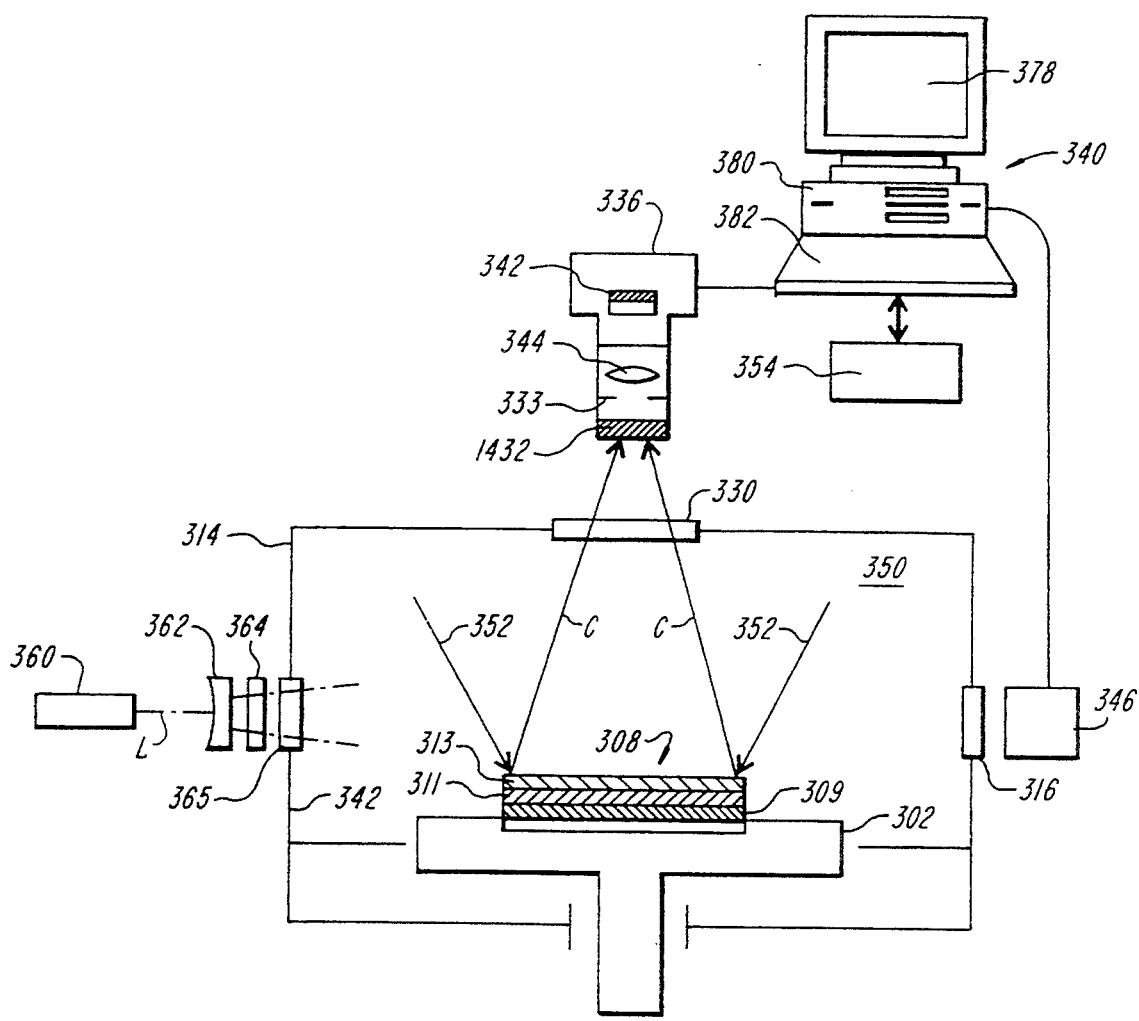
FIG. 14 shows schematically an embodiment of the invention used for measuring the absolute thickness of a thin film with an optional auxiliary light source.

Another embodiment of the apparatus of the invention, shown schematically in FIG. 14, can be used to determine absolute film thickness, in conjunction with either the film removal or film addition processes.

This embodiment of the apparatus is virtually identical to that of FIG. 4, except that rather than a narrow bandpass filter, 332, a different filter 1432 is used, which selectively admits only a certain narrow bandwidth of light for a brief length of time, blocking out all other wavelengths. At a different moment of time, a different wavelength of light is admitted, and at a different time, yet another different wavelength is admitted. The filter periodically cycles through the various wavelengths, admitting a repeating series of different wavelengths of light over time. (As shown in FIG. 14, the light 360, and second window 365 are optional, as is the case for the basic embodiment explained above, if additional illumination is desired. The light can be a laser and an expander or a bright broad spectrum light.)

According to one preferred embodiment of the absolute thickness version of the invention, a computer controlled, electrically tunable wavelength filter 1432 is used. Such a tunable filter, such as is available from Cambridge Research Instruments, of Cambridge, Mass., under the trade designation VARISPEC, allows random access to any wavelength in the visible, and UV or near IR spectra, and is fast enough to view ten or more wavelengths while maintaining good film etching rate temporal resolution. The required parameters for such a tunable filter are: 1) a tuning range of approximately 400 to 800 nm; 2) random wavelength access at a speed of 50 ms or less; 3) a field of view wide enough to cover all or most of the wafer 308, a half angle of 15° or more being preferable; and 4) the ability of being interfaced to a data processing unit, such as computer 340.

The etching rate is determined at each of several wavelengths using the same method steps as have been discussed above. One outcome of using this embodiment of the invention is that an increase in the accuracy of the rate determination is achieved. This comes about simply by averaging a larger number of rate measurements, one for each wavelength monitored.

Figure 1:
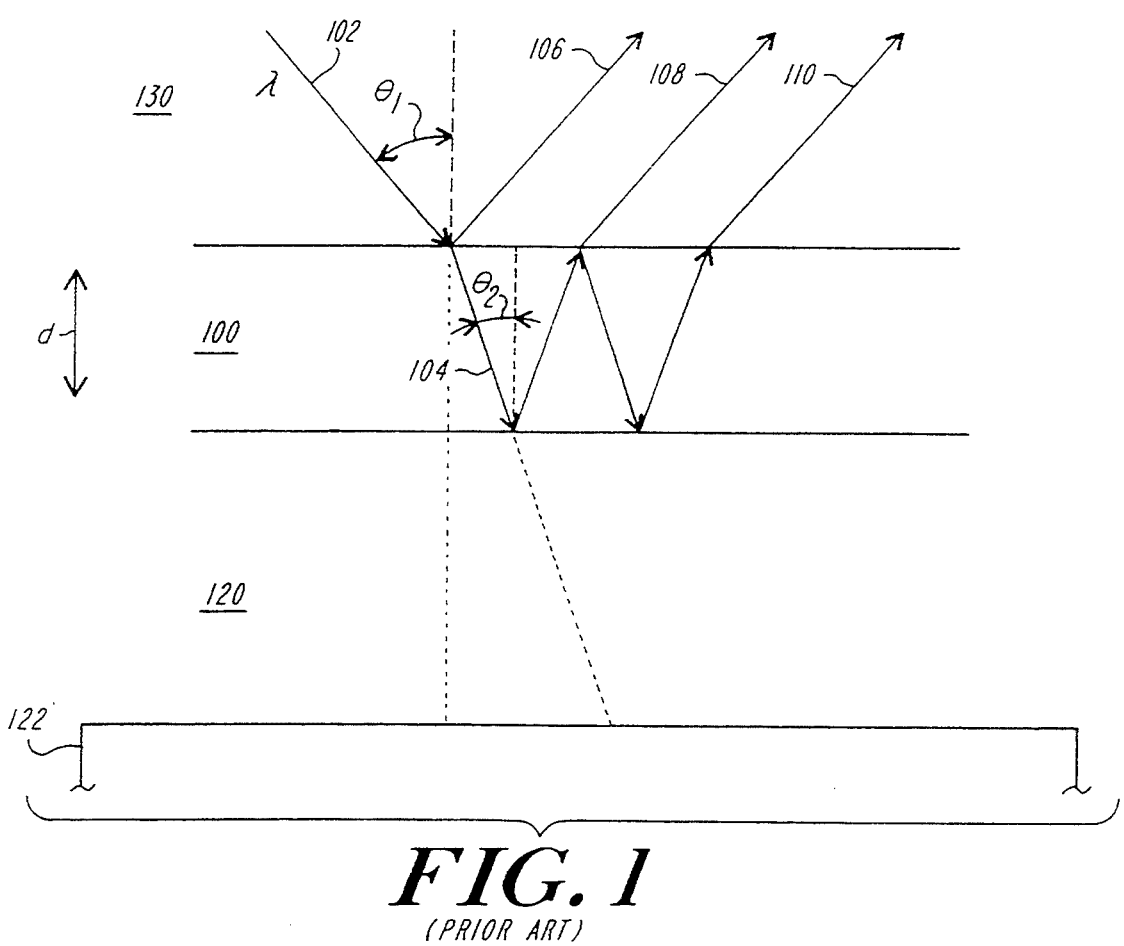
FIG. 1 shows schematically an incident light, which encounters a thin film, reflects from the surface of the thin film and also reflects from the interface between the thin film and the substrate.
Figure 2:
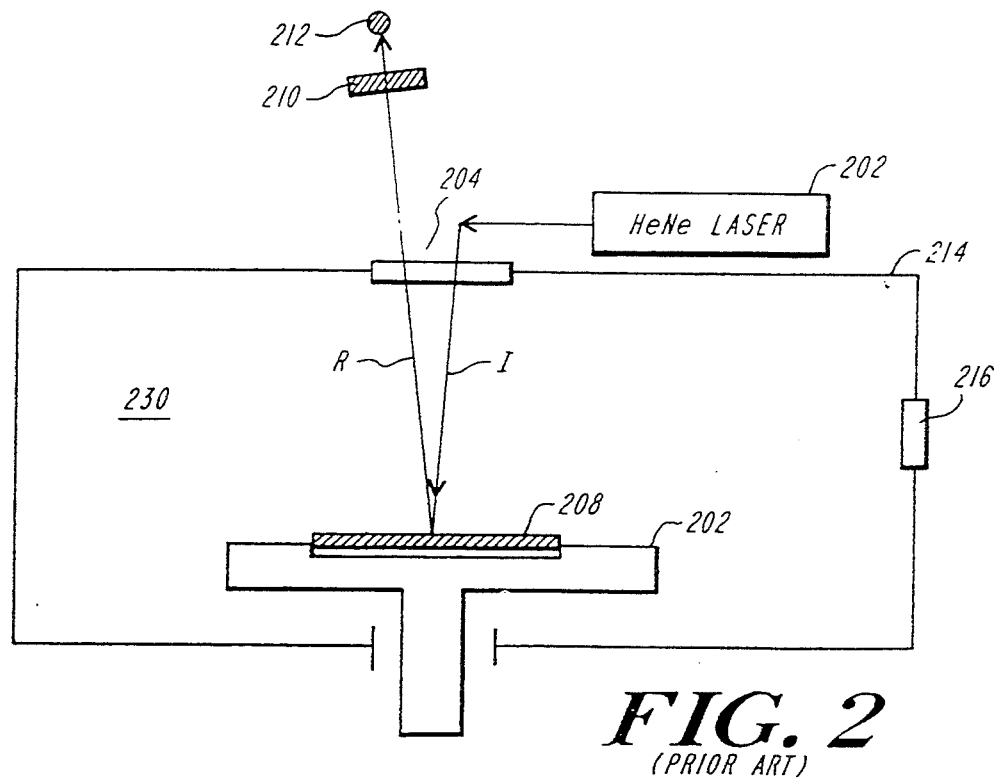
FIG. 2 shows schematically a prior art Helium-Neon laser interferometry apparatus in which a laser beam specularly reflected from the surface of a film is measured as a function of time.
Figure 3:
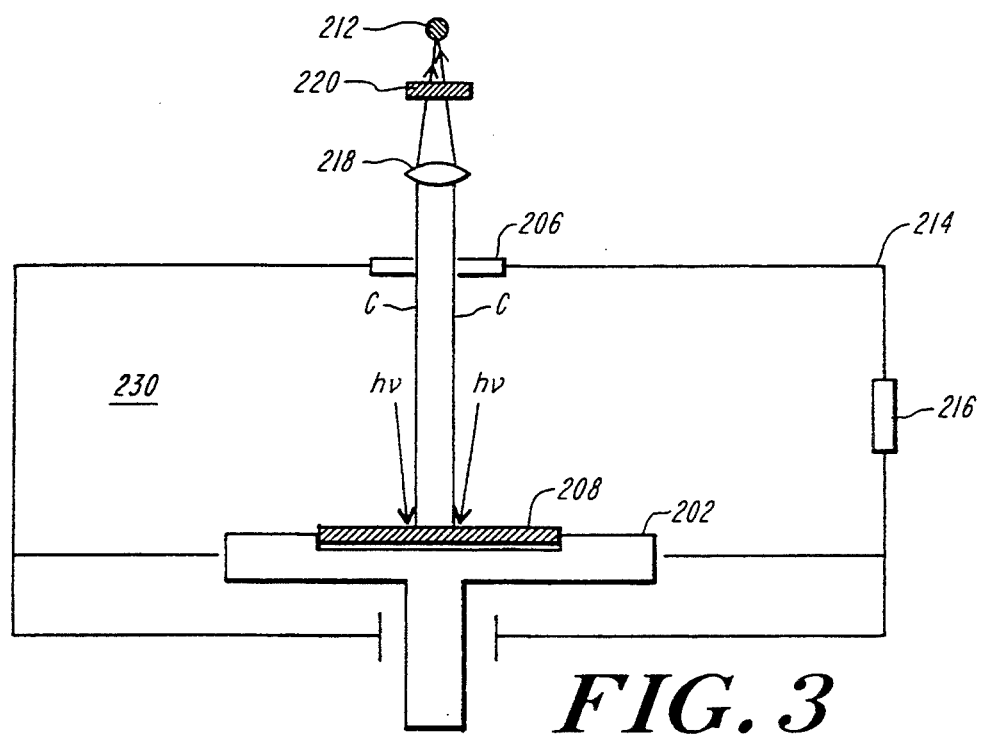
FIG. 3 shows schematically a prior art apparatus for plasma optical emission interferometry in which the emission from the plasma is reflected by the wafer, undergoing interference.

The film thickness is determined by measuring its reflectivity at more than one wavelength, as follows. The reflectivity at each wavelength is measured to be the ratio of the intensity of radiation reflected from the film to that not reflected from it. This is necessary to account for variations in radiation intensity as a function of wavelength. The film thickness can then be determined at a particular instant in time by matching the measured film reflectivity as a function of wavelength to the calculated reflectivity as a function of wavelength for a range of assumed film thicknesses. The range can usually be limited using the starting thickness, known to a reasonable approximation, and the measured electromagnetic radiation. The film reflectivity, R, as a function of wavelength $\lambda$, and film thickness, d, can be calculated by standard methods, as described below:

$$R = I''/I, \tag{8}$$

where $I$ is the intensity of radiation incident on the substrate and $I''$ is the reflected intensity. The intensity of radiation is proportional to the square of the electric field strength, E, of the light, so:

$$R = (E''/E)^2, \tag{9}$$

where $$E'' = E_{106} + E_{108} + E_{110}, \tag{10}$$

i.e., the sum of the electric field strengths due to all of the reflections from the various rays 106, 108, 110, as shown in FIG. 1. Summing and then squaring the electric field, using equations 10 and 9, respectively, results in the observed interference in the film's reflectivity. The reflected electric field strengths required in Eq. 10 are available in standard texts, e.g., J. D. Jackson, *Classical Electrodynamics*, John Wiley & Sons (1975), pp. 278–282. Jackson gives the reflected and transmitted electric field strengths at an interface. For non-normal incidence the two possible polarizations, $E_\perp$ and $E_\parallel$ of the electric field must be treated separately. The radiation in a plasma is generally unpolarized so:

$$(E'')^2 = (E_\perp)^2 + (e_\parallel)^2, \tag{11}$$

where $E_\perp$ and $E_\parallel$ are calculated separately, using Eq. 10. Jackson also gives $E_\perp$ and $E_\parallel$.

The additional phase shift, $\Delta\Phi$, introduced on each two way traversal of the substrate film 308 must also be included for rays 108 and 110. This phase shift is given by:

$$\frac{\Delta\phi}{2\pi} = \frac{\Delta l_{opt}}{\lambda} = \frac{2n_2 d \cos(\theta_2)}{\lambda}. \tag{12}$$

(This is essentially eq. 2 above, divided by $\lambda$.) The data processing unit calculates R as a function of $\lambda$ and d and compares this to the measured reflectivity vs. wavelength in order to obtain the film thickness. The accuracy of this determination can be improved by increasing the number of wavelengths used and by spreading them over a broad spectrum. Ten wavelengths distributed over the spectral range of the CCD 342 is more than sufficient for most applications.

Rather than using a computer controlled tunable wavelength filter, a motor driven filter wheel can be used.

The data acquisition steps of the method of the invention using the multiple wavelength apparatus include those of the single wavelength version, and are shown schematically in dotted line outline in FIG. 15. The difference is that it is necessary to alter the hardware periodically so that a different wavelength of light is admitted to the CCD. This step is indicated 1517 between the step 1516 of saving the signal to a file and the step 1518 to test whether an exit command has been received.

Figure 16:
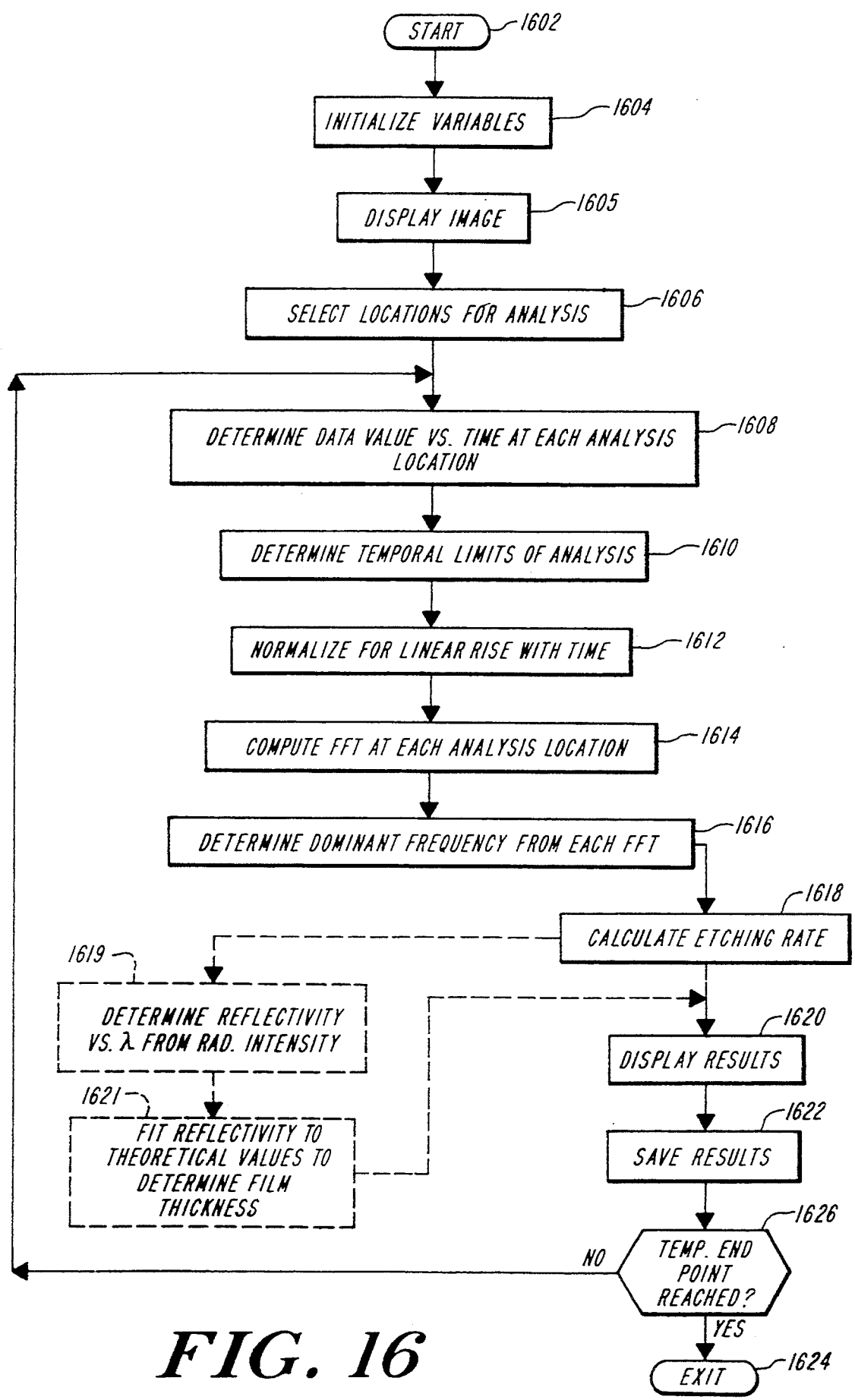
FIG. 16 shows schematically in flow chart form steps of embodiments of the method of the invention for data analysis.

Similarly, the data analysis steps of the method of the invention using the multiple wavelength apparatus include those of the single wavelength version, and are shown schematically in dotted line outline in FIG. 16. The difference is that it is necessary to determine 1619 the reflectivity from measured radiation intensities and correlate that reflectivity to the wavelength λ. Following this step, the reflectivity is fitted 1621 to theoretically calculated values to determine absolute film thickness.

Another alternative to the tunable wavelength filter or the filter wheel is to use a color CCD array 342, with no filter 1832. A color CCD array is actually three sets of arrays of CCD detector elements (pixels), each of the three pixels having a different, fairly broadband wavelength filter (such as red, green, and blue) placed in front of it. The accuracy of the film thickness measurement would be lower with a color CCD, due to the broadband detection and due to the fact that only three wavelengths would be used.

The rate of change in film thickness can also be determined using a color CCD array by monitoring the modulation in intensity of each of the different colors, i.e., wavelengths. This procedure is the same as that used to obtain rate information with the single wavelength embodiment of the invention discussed above.

The multiple wavelength embodiment of the invention is equally applicable to processes where thin films are being reduced or increased in thickness.

The foregoing embodiments have all been described in terms of a chamber, such as a plasma chamber, with a viewing port. The invention is, however, also applicable to situations where film thickness is changed in an open environment, such as chemical vapor deposition applied to parts on moving belts. In such a case, there is no chamber and thus, no window. All that is required is a light source, bright enough to illuminate the film to the degree necessary given the sensitivity of the CCD, a CCD, lens and iris, and data processing and apparatus control equipment suitable to analyze the collected data.

Thus, the invention includes a new technique for the real-time in situ measurement of etching rate uniformity using a CCD camera. The etching rates determined from this technique compare well with those measured using laser interferometry. For plasma etching, the CCD technique is applicable almost anywhere that laser interferometry is used. However, the CCD system is much more flexible in data analysis and provides uniformity information that laser interferometry can not provide. The apparatus of the invention is capable of measuring etching rates over an entire 100-mm wafer or greater allowing for analysis at one point, several points or regions along a line, over a die or over an entire wafer. The technique can be easily scaled up to monitor 200-mm wafers while using only a 50-mm optical view port.

The apparatus of the invention for measuring rate uniformity is a valuable development tool, yielding real-time measurement of etching rate and uniformity. It has potential use as a real-time diagnostic for process control. The method and apparatus can be extended to work in other processes such as measuring deposition rates and uniformity in PECVD. Use of a laser or other light source can improve signal to noise, but is considerably less convenient to use, especially for large areas. An external light source also allows using the method of the invention with systems without a plasma.

Another embodiment of the apparatus of the invention can be used to determine the absolute thickness of a thin film undergoing thickness changes. It is not necessary to know the thickness before the thickness changing process began.

The foregoing discussion should be understood as illustrative and should not be considered to be limiting in any sense. While this invention has been particularly shown and described with references to preferred embodiments thereof, it will be understood by those skilled in the art that various changes in form and details may be made therein without departing from the spirit and scope of the invention as defined by the claims.

The invention contemplates use of a CCD array to measure the change in thickness of thin films in any process, whether the film thickness is increasing or decreasing. Further, it can be applied to any process to measure the absolute thickness of the film.

What is required is visual access to the environment in which the film is being treated, such as through a window, and a means of illuminating the thin film so that its image can be captured by a CCD array.

Having described the invention, what is claimed is:

1. An apparatus for measuring change in the thickness of a thin film on a substrate supported on a support in the presence of electromagnetic plasma emission radiation emitted throughout a volume of gas, the apparatus comprising:
   a. spaced away from said support, and on the opposite side of said volume of gas that emits said plasma emission, an array of means for sensing plasma emission radiation reflected from the thin film, the array providing an individually recoverable signal for each sensing means of the array, each signal corresponding to a region of the film;
   b. filter means for transmitting plasma emission radiation of at least one selected range of wavelengths to said array of sensing means;
   c. means for focusing plasma emission radiation reflected from said film, said focusing means comprising an iris and arranged between said thin film and said array such that an image of a region of said film is focused onto said array;
   d. means for storing a time sequence of data signals corresponding to the signals generated by the array of sensing means over a period of time in response to plasma emission radiation transmitted through said filter means and in response to no other significant illumination, reflected from said film; and
   data processing means for comparing the data signals for at least one sensing means of the array over a portion of said time period, and from the comparison, determining the change of the thickness of the film over said portion of said time period at the region of film focused upon said at least one sensing means of the array.

2. The apparatus of claim 1, further comprising means for measuring the length of the time period over which data signals that have been compared have been generated, and data processing means for using the measured time and the change of the film thickness to determine the rate of change of the thickness of the film at the region of film during the period of time.

3. The apparatus of claim 1, further comprising means for displaying symbols that correspond to the determined change of film thickness.

4. The apparatus of claim 1, said substrate residing in a walled chamber, said apparatus further comprising, through a wall of said chamber, a transparent means for transmitting plasma emission radiation of said selected range of wavelengths, reflected from said film to said array, and which transparent means is smaller in its largest dimension than the largest dimension of said region of said thin film to be imaged onto said array.

5. The apparatus of claim 4, further wherein the largest dimension of said transparent means is less than three quarters of the largest dimension of said thin film.

6. The apparatus of claim 5, further wherein the largest dimension of said transparent means is less than one half of the largest dimension of said thin film.

7. The apparatus of claim 1, said filter means comprising means for transmitting a first selected range of wavelengths of plasma emission radiation to said array of sensing means while blocking other ranges of wavelengths of radiation, and subsequently for transmitting at least a second, different selected range of wavelengths of plasma emission radiation to said array while blocking other ranges of wavelengths of radiation.

8. The apparatus of claim 7, said filter means comprising means for transmitting at least a third, fourth and fifth different selected range of wavelengths of plasma emission radiation at different times to said array while blocking other ranges of wavelengths of plasma emission radiation.

9. The apparatus of claim 7, said data processing means further comprising means for determining the reflectivity of the film for said at least two selected ranges of wavelengths based on the intensity of the plasma emission radiation focused upon said array.

10. The apparatus of claim 9, said data processing means further comprising means for comparing said reflectivity to a predetermined set of correlations between reflectivity and film thickness, to determine the thickness of said film.

11. The apparatus of claim 1, said array comprising at least one hundred individual means for sensing electromagnetic radiation.

12. The apparatus of claim 11, said array comprising a CCD.

13. The apparatus of claim 1, further comprising means for synchronizing said signals generated by said array to any periodic fluctuation in said plasma emission radiation caused by phenomena not under analysis.

14. The apparatus of claim 13, where said phenomenon causing fluctuations is a fluctuating magnetic field.

15. An apparatus for collecting information regarding the change in the thickness of a thin film being reduced in thickness on a substrate supported on a support in the presence of plasma emission radiation emitted throughout a volume of gas, the apparatus comprising:
  a. spaced away from said support, and on the opposite side of said volume of gas that emits said plasma emission, an array of means for sensing plasma emission radiation reflected from the thin film, the array providing an individually recoverable signal for each sensing means of the array, each signal corresponding to a region of the film;
  b. filter means for transmitting plasma emission radiation of at least one selected range of wavelengths to said array of sensing means;
  c. means for focusing plasma emission radiation reflected from said film, said focusing means arranged between said thin film and said array such that an image of a region of said film is focused onto said array; and
  d. means for storing a time sequence of data signals corresponding to the signals generated by the array of sensing means over a period of time in response to plasma emission radiation transmitted through said filter means and in response to no other significant illumination, reflected from said film.

16. The apparatus of claim 15, further comprising means for displaying said time sequence of data signals in operator perceivable symbols.

17. The apparatus of claim 15, further comprising data processing means for analyzing said time sequence of data signals to determine if individual components of said time sequence conform to a predetermined relationship.

18. The apparatus of claim 15, said array comprising a CCD.

19. A method for determining when a layer of a thin film has been completely removed by a thickness reduction process in the presence of plasma emission radiation emitted throughout a volume of gas at a plurality of locations over the area of said thin film, comprising the steps of:
  a. reflecting said plasma emission radiation from said thin film, in the absence of any other significant illumination of said thin film, during the time said film is being reduced in thickness;
  b. focusing at least one selected range of wavelengths of said plasma emission radiation reflected from said film onto an array of means for sensing plasma emission radiation which provides an individually recoverable signal for each sensing means of the array, each signal corresponding to a region of the film said array being located on the opposite side of said volume of gas that emits said plasma emission from said film;
  c. generating a time sequence of data signals corresponding to the signals generated by the array of sensing means over a period of time in response to plasma emission radiation focused on said array;
  d. correlating the amplitude of said data signals with the time during which said signals were generated;
  e. identifying a time periodic pattern in the amplitude of said data signals;
  f. at selected time intervals, comparing the rate of change of said amplitude of said data signals with said periodic pattern; and
  g. determining that said film has been removed if said rate of change of said amplitude of said signals departs from said periodic pattern.

20. The method of claim 19, said array comprising a CCD.

21. A method for determining the rate of change of the thickness of a thin film to which is being applied a process of changing film thickness in the presence of plasma emission radiation emitted throughout a volume of gas at a plurality of locations over the area of said thin film, said method comprising the steps of:
  a. reflecting plasma emission radiation from said thin film, in the absence of any other significant illumination of said film, during the time said film is being changed in thickness;
  b. focusing at least one selected range of wavelengths of said plasma emission radiation reflected from said film onto an array of means for sensing electromagnetic radiation which provides an individually recoverable signal for each sensing means of the array, each signal corresponding to a region of the film, said array being located on the opposite side of said volume of gas that emits said plasma emission from said film;

c. generating a time sequence of data signals corresponding to the signals generated by the array of sensing means over a period of time in response to radiation focused on said array;

d. correlating the amplitude of said data signals with the time during which said signals were generated;

e. identifying a periodicity in the rate of change of the amplitude of said data signals; and f. determining the rate of change of the thickness of said film by relating said periodicity to said selected range of wavelengths.

22. The method of claim 21, further comprising the steps of:

a. generating a time sequence of images of said thin film using said time sequence of data signals;

b. from said time sequence of images, identifying a plurality of locations over the area of said thin film and conducting said steps of identifying a periodicity and determining the rate of change at each of said plurality of locations.

23. The method of claim 22, further comprising the step of generating an image of said film showing said rate of change at said locations at a selected time.

24. The method of claim 21, said process of changing film thickness comprising a film thickness reduction process.

25. The method of claim 21 said process of changing film thickness comprising a film thickness addition process.

26. The method of claim 21, further comprising the step of synchronizing the generation of said time sequence of data signals to any periodic fluctuation in said plasma emission radiation caused by phenomena not under analysis.

27. The method of claim 26, where said phenomenon causing fluctuations is a magnetic field.

28. A method for determining the thickness of a thin film at a plurality of locations over the area of said thin film, said method comprising the steps of:

a. emitting plasma emission radiation throughout a volume of gas and reflecting said plasma emission radiation from said thin film, in the absence of any other significant illumination of said film, during the time said film is being changed in thickness;

b. focusing at least two selected ranges of wavelengths of said plasma emission radiation reflected from said film onto an array of means for sensing plasma emission radiation which provides an individually recoverable signal for each sensing means of the array, each signal corresponding to a region of the film said array being located on the opposite side of said volume of gas that emits said plasma emission from said film;

c. generating a set of data signals corresponding to the signals generated by the array of sensing means in response to radiation of said selected at least two ranges of wavelengths focused on said array;

d. correlating the amplitudes of said data signals with the wavelength of said plasma emission radiation from which said signals were generated;

e. comparing said correlation of the amplitudes to a predetermined correlation between amplitudes and film thickness; and f. determining the thickness of said film by said comparison.

29. The method of claim 28, said array comprising a CCD.

* * * * *